US006989564B2

(12) United States Patent
Sakagami

(10) Patent No.: US 6,989,564 B2
(45) Date of Patent: Jan. 24, 2006

(54) NONVOLATILE SEMICONDUCTOR STORAGE APPARATUS AND METHOD OF MANUFACTURING THE SAME

(75) Inventor: Eiji Sakagami, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/927,324

(22) Filed: Aug. 27, 2004

(65) Prior Publication Data

US 2005/0083750 A1    Apr. 21, 2005

(30) Foreign Application Priority Data

Aug. 29, 2003  (JP)  ............................. 2003-306789

(51) Int. Cl.
*H01L 29/788* (2006.01)
(52) U.S. Cl. ...................... 257/315; 257/316; 257/317; 257/318; 365/185.01; 365/185.05; 365/185.11
(58) Field of Classification Search ................ 257/316, 257/317, 318; 365/185.01, 185.05, 185.11
See application file for complete search history.

(56) References Cited

U.S. PATENT DOCUMENTS 6,577,533 B2 * 6/2003 Sakui et al. ............ 365/185.05

FOREIGN PATENT DOCUMENTS

JP          2000-269467           9/2000

* cited by examiner

*Primary Examiner*—Mai-Huong Tran
(74) *Attorney, Agent, or Firm*—Oblon, Spivak, McClelland, Maier & Neustadt, P.C.

(57) ABSTRACT

A NOR type semiconductor storage comprising memory cells, word lines, local and main source lines of metal and bit lines is disclosed. Two adjacent cells on a column form one set and share the drain region. Two adjacent cell sets on a column share the source region. Cell columns are isolated by trench type element isolation regions. A local source line run on and is connected to the source regions of the cells on a row. The main source lines are arranged intermittently between the bit line columns and are connected to the local source lines. A height of embedded layers in the element isolation regions under the local source lines or a height of a portion of the embedded layers contacting the substrate is lower than an upper surface of the source regions under the local source lines. The local source lines are connected to the well region.

6 Claims, 19 Drawing Sheets

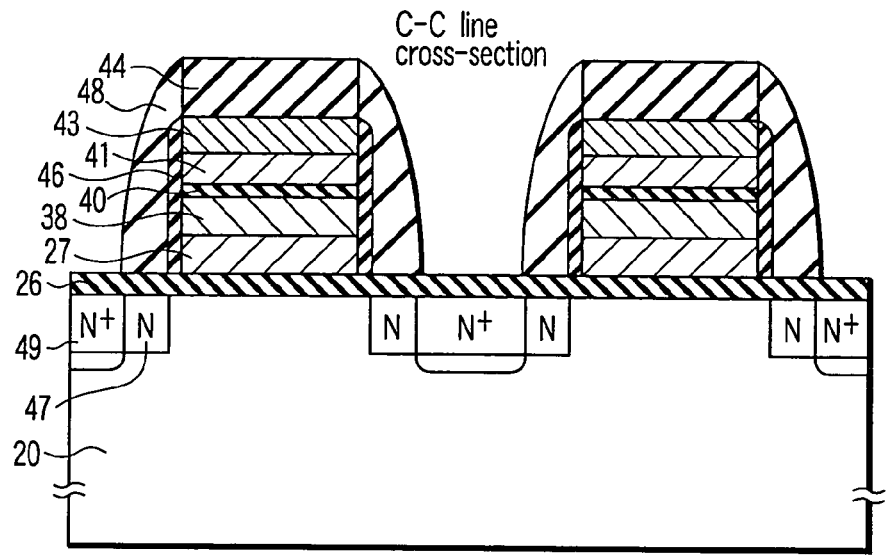
F I G. 22
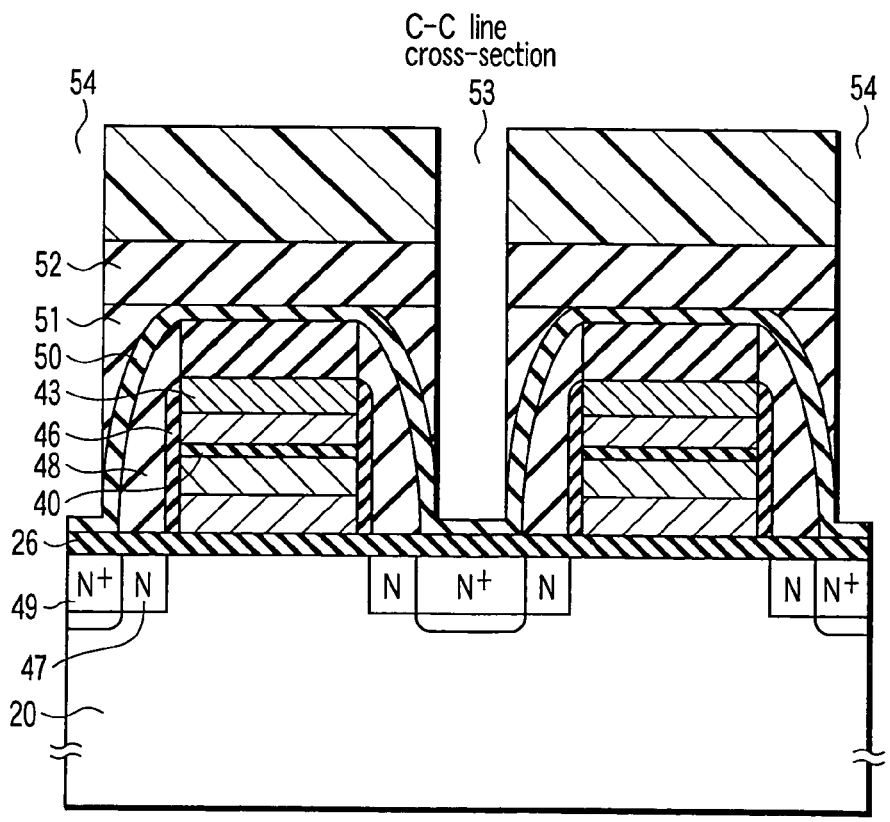
F I G. 23

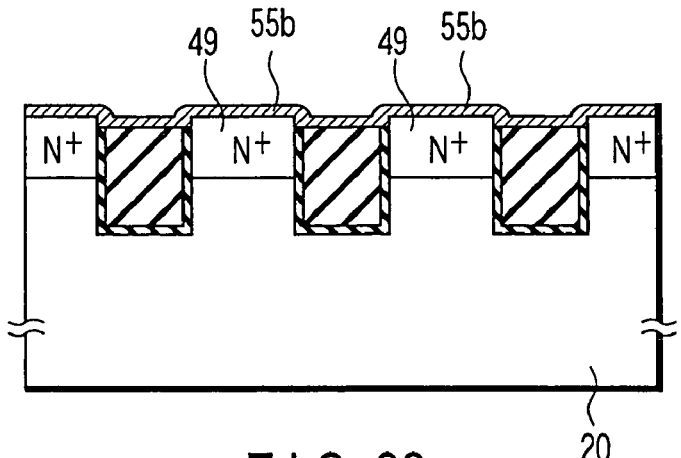
F I G. 28
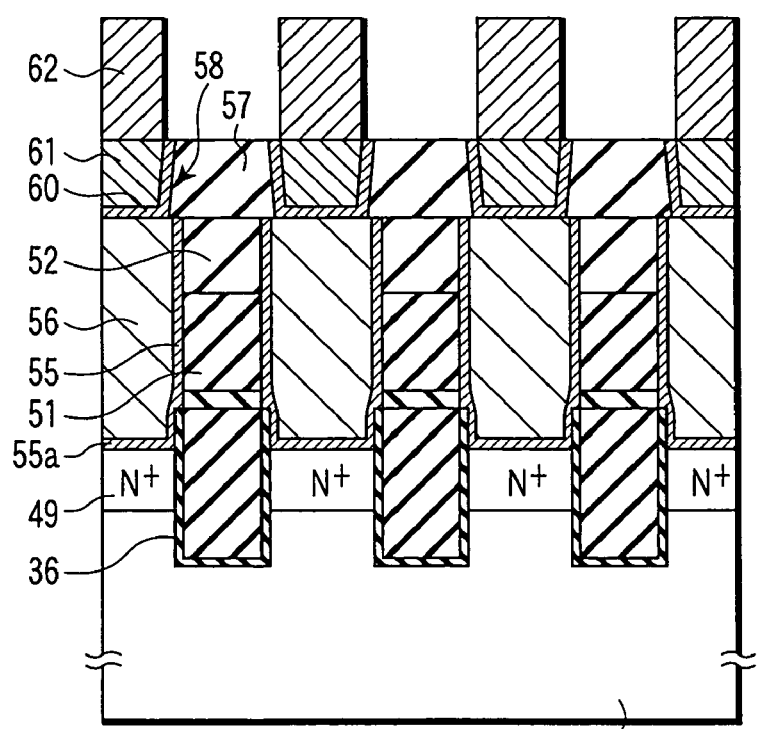
F I G. 29

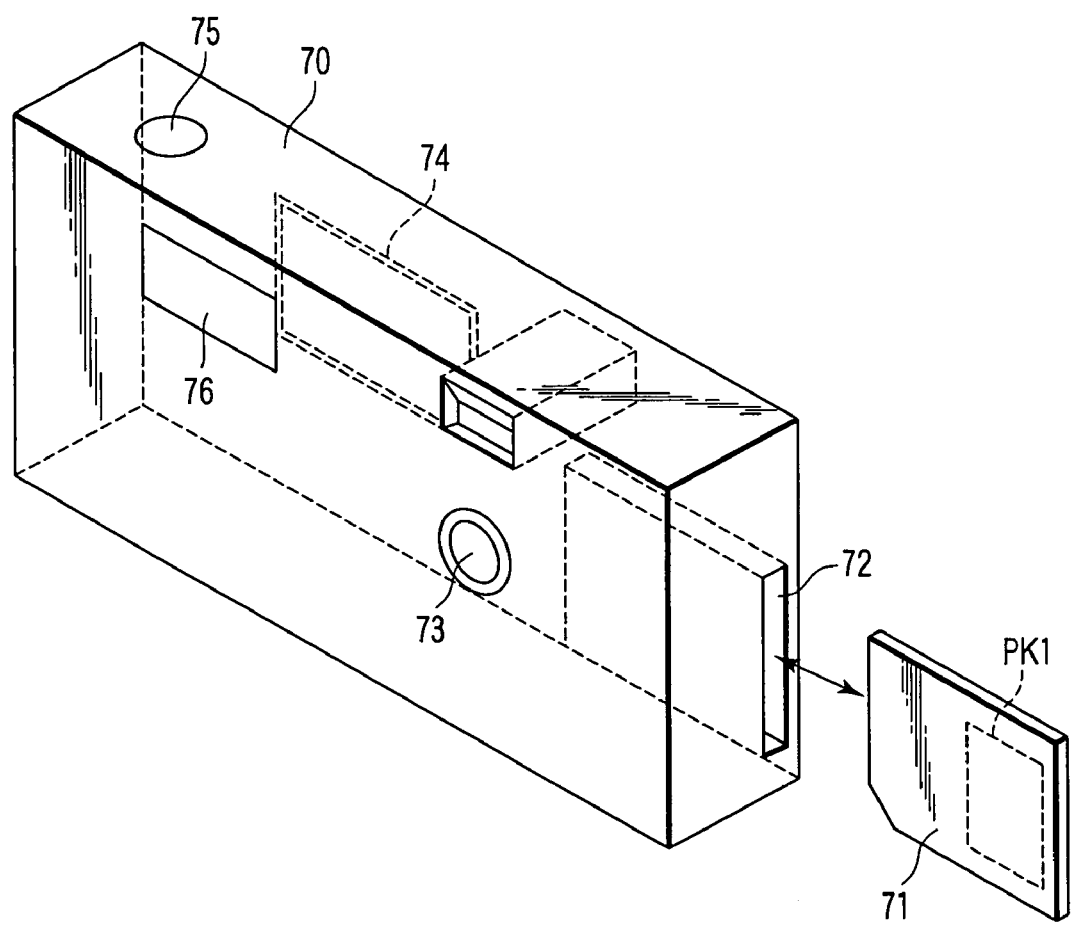
F I G. 40

NONVOLATILE SEMICONDUCTOR STORAGE APPARATUS AND METHOD OF MANUFACTURING THE SAME

CROSS-REFERENCE TO RELATED APPLICATIONS

This application is based upon and claims the benefit of priority from prior Japanese Patent Application No. 2003-306789, filed Aug. 29, 2003, the entire contents of which are incorporated herein by reference.

BACKGROUND OF THE INVENTION

1. Field of the Invention

The present invention relates to a nonvolatile semiconductor storage apparatus and a method of manufacturing the same, and in particular, to a structure of a source wiring layer in a cell array of a NOR type nonvolatile semiconductor memory and a method of manufacturing the same.

2. Description of the Related Art

FIG. 1 shows an equivalent circuit of a part of a cell array of a NOR type flash memory of a floating gate structure. FIG. 2 shows a layout of the cell array of the NOR type flash memory in FIG. 1.

The NOR type cell array shown in FIGS. 1 and 2 is formed of a plurality of memory cells MC arranged in a matrix form in a well region formed in a surface layer of a semiconductor substrate. Each of the memory cells MC comprises a cell transistor. The cell transistor comprises an active region (i.e., impurity diffusion layers for source/drain and a channel layer) formed in the well region, and a two-layer gate structure (i.e., a structure in which a control gate is formed on a floating gate via an inter-gate insulating film) via an gate insulating film on the well region.

In the above-described NOR type cell array, two adjacent memory cells in a column direction combine to form a set of memory cells, and the two adjacent memory cells share a drain region D. Two adjacent sets of the two adjacent memory cells in the column direction share a source region S. Columns of the memory cells are separated from each other by a shallow trench type isolation (STI) region.

A plurality of word lines WL are arranged on the cell array in a row direction. Each of the word lines WL is commonly connected to control gate electrodes of the memory cells on a corresponding row.

A plurality of local source lines LS are arranged on the cell array in the row direction. Each of the local source lines LS is formed of a metal wiring layer and commonly connected to the shared source regions S of the memory cells on a corresponding row.

Further, a plurality of bit lines BL, which are formed of metal wiring layers and thus low in resistance, are arranged on the cell array in the column direction. Each of the bit lines BL is commonly connected to the shared drain regions D of the memory cells on a corresponding column.

A plurality of main source lines MS, which are formed of metal wiring layers and thus low in resistance, are intermittently arranged in the column direction between the arrangements of the bit lines BL, although in FIGS. 1 and 2, only one main source line MS is shown. Each of the main source lines MS is commonly connected to the plurality of local source lines LS.

As described above, the drains D of the same column, each shared by the two memory cells forming a memory cell set in the column direction, are commonly connected to the low resistance bit line BL via drain contacts DC. Further, the sources S, each shared by adjacent two sets of memory cells in the column direction, are connected to the local source line LS extending in parallel to and between two adjacent word lines WL. The local source line LS is connected to the main source MS of a low resistance via a source line contact SC, and is supplied with an electric potential from the outside of the cell array.

In the NOR type flash memory having the above-described configuration, when an electron injection is carried out to inject electrons into a floating gate by using a channel hot electron injection to write data to the cell, ground potential is applied to the source S and the well region of the cell. Further, predetermined potentials by which the generation efficiency of hot electrons are made maximum are applied to the control gate and the drain D via the word line WL and the bit line BL, respectively, from an external circuit.

In such an electron injecting method using the channel hot electrons, a sufficient writing of data into the cell is obtained only when a large electric current is flown through the source and the drain of the cell, since the electron injection efficiency into the floating gate is low. Accordingly, it is desirable that the source and the drain of the cell be connected to a predetermined potential via a low resistance.

However, since the source wiring layer is formed of the local source line LS of a high resistance and the main source line MS of a low resistance, the wiring length is long, and the resistance of the source wiring layer up to the source of the cell is large. Since a large electric current flows in the source wiring layer at the time of writing data, the resistance of the source wiring layer can not be negligible, and a rise of the source electric potential of the selected cell (a rise in the electric potential of the local source line) arises, which makes the writing insufficient.

In particular, when data writings are simultaneously carried out to a plurality of cells by selecting a plurality of bit lines BL at the same time, electric current for writing data to the plurality of cells flows simultaneously into the same source line. Therefore, a rise in the electric potential of the source line is made large, and a significant deterioration in the writing characteristic is brought about.

In order to solve the problem, it can be thought that a rise in the electric potential of the source line is suppressed by increasing electric contact points between the low resistance main source line MS and the local source line LS, i.e., by making intervals among the adjacent source lines MS small, to make the wiring length of the local source line relatively short. However, the more the number of the main source lines increases, the more the area of the cell array increases.

In "Semiconductor Integrated Circuit" in Jpn. Pat. Appln. KOKAI Publication No. 2000-269467 (FIGS. 1 and 2), there is disclosed a technique in which a recess portion is formed in the STI region by etching the STI region up to a position lower than the surface of the element region to expose the n-type source regions of both sides of the STI region, and a wiring conductor layer (local source line) is embedded in the recess portion to electrically connect the exposed n-type source regions at the both sides of the region STI to each other.

As described above, in convention, there has been the problem that since the route of the source wiring layer is long, the resistance of the source wiring layer up to the source of the cell is made high, floating of the electric potential arises at the source portion of the selected cell at the time of writing, and the writing characteristic deteriorates.

BRIEF SUMMARY OF THE INVENTION

According to an aspect of the present invention, there is provided a nonvolatile semiconductor storage apparatus comprising:

a NOR type cell array including memory cells arranged in a row direction and a column direction, each of the memory cells having a source region, a drain region and a channel region formed in a well region formed in a surface layer of a semiconductor substrate, a floating gate formed on the well region via a gate insulating film and a control gate formed on the floating gate via an inter-gate insulating film, two adjacent the memory cells arranged in the column direction forming a set and sharing the drain region, two adjacent sets of the memory cells arranged in the column direction sharing the source region, and a plurality of columns of the memory cells being isolated by trench type element isolation regions;

a plurality of word lines arranged on the cell array and extending in the row direction in correspondence to a plurality of rows, each of the word lines being commonly connected to a control gate of each of the memory cells on a corresponding row;

a plurality of local source lines formed of metal wirings, the local source lines being arranged on the cell array and extending in the row direction in correspondence to a plurality of rows, each of the local source lines extending in the row direction to run on the source regions of the memory cells on a corresponding row and the element isolation regions isolating the columns of the memory cells, and being commonly connected to the source regions of the memory cells on the corresponding row;

a plurality of bit lines formed of metal wirings, the metal wirings being arranged on the cell array and extending in the column direction in correspondence to a plurality of columns, and each of the bit lines being commonly connected to the drain regions of the memory cells on a corresponding column; and a plurality of main source lines formed of metal wirings, the main source lines being arranged intermittently between the columns of the bit lines on the cell array and extending in the column direction, and each of the main source lines being commonly connected to the local source lines, wherein a height of embedded material layers in the element isolation regions under the local source lines or a height of a portion of the embedded material layers contacting the semiconductor substrate is lower than an upper surface of the source regions under the local source lines, and the local source lines and the well region are electrically connected to each other in the cell array.

According to another aspect of the present invention, there is provided a method of manufacturing a nonvolatile semiconductor storage apparatus comprising:

a NOR type cell array including memory cells arranged in a row direction and a column direction, each of the memory cells having a source region, a drain region and a channel region formed in a well region formed in a surface layer of a semiconductor substrate, a floating gate formed on the well region via a gate insulating film and a control gate formed on the floating gate via an inter-gate insulating film, two adjacent the memory cells arranged in the column direction forming a set and sharing the drain region, two adjacent sets of the memory cells arranged in the column direction sharing the source region, and a plurality of columns of the memory cells being isolated by trench type element isolation regions;

a plurality of word lines arranged on the cell array and extending in the row direction in correspondence to a plurality of rows, each of the word lines being commonly connected to a control gate of each of the memory cells on a corresponding row;

a plurality of local source lines formed of metal wirings, the local source lines being arranged on the cell array and extending in the row direction in correspondence to a plurality of rows, each of the local source lines extending in the row direction to run on the source regions of the memory cells on a corresponding row and the element isolation regions isolating the columns of the memory cells, and being commonly connected to the source regions of the memory cells on the corresponding row;

a plurality of bit lines formed of metal wirings, the metal wirings being arranged on the cell array and extending in the column direction in correspondence to a plurality of columns, and each of the bit lines being commonly connected to the drain regions of the memory cells on a corresponding column; and a plurality of main source lines formed of metal wirings, the main source lines being arranged intermittently between the columns of the bit lines on the cell array and extending in the column direction, and each of the main source lines being commonly connected to the local source lines, in which the method comprising:

forming a gate insulating film on a well region formed on a surface layer of a silicon substrate;

forming a first electrode layer for a floating gate on the gate insulating film;

selectively removing the first electrode layer, the gate insulating film, and the well region to form a groove for an element isolation region in a self-align with the first electrode layer;

embedding an element isolation film in the groove for an element isolation region;

etching a portion of the element isolation film in the groove, which is under a local source line to be later formed, so that a height of the element isolation film or a height of a portion of the element isolation film contacting the semiconductor substrate is lower than an upper surface of a source region to be formed at a later step under the local source line, forming an inter-gate insulating film over the semiconductor substrate;

forming a second electrode layer over the inter-gate insulating film;

forming a gate processing pattern on the second electrode layer, and by using the gate processing pattern as a mask, patterning the second electrode layer, the inter-gate insulating film, and the first electrode layer to form a control gate line and a floating gate separated each memory cell;

forming a drain region and a source region of a memory cell;

forming an interlayer insulating film over the substrate;

forming a bit line contact hole and a local source line embedding groove in the interlayer insulating film, the bit line contact hole being formed on the drain regions of memory cells on a same column in the cell array, and the local source line embedding groove being formed to extend in a row direction over the source regions of the memory cells on a same row and the element isolation regions between the columns of the memory cells of the cell array; and depositing metal over the semiconductor substrate to embed the metal in the bit line contact hole and the local source line embedding groove to form the bit line and the local source line which is electrically connected to the well region.

According to a further aspect of the present invention, there is provided a method of manufacturing a nonvolatile semiconductor storage apparatus comprising:

a NOR type cell array including memory cells arranged in a row direction and a column direction, each of the memory cells having a source region, a drain region and a channel region formed in a well region formed in a surface layer of a semiconductor substrate, a floating gate formed on the well region via a gate insulating film and a control gate formed on the floating gate via an inter-gate insulating film, two adjacent the memory cells arranged in the column direction forming a set and sharing the drain region, two adjacent sets of the memory cells arranged in the column direction sharing the source region, and a plurality of columns of the memory cells being isolated by trench type element isolation regions;

a plurality of word lines arranged on the cell array and extending in the row direction in correspondence to a plurality of rows, each of the word lines being commonly connected to a control gate of each of the memory cells on a corresponding row;

a plurality of local source lines formed of metal wirings, the local source lines being arranged on the cell array and extending in the row direction in correspondence to a plurality of rows, each of the local source lines extending in the row direction to run on the source regions of the memory cells on a corresponding row and the element isolation regions isolating the columns of the memory cells, and being commonly connected to the source regions of the memory cells on the corresponding row;

a plurality of bit lines formed of metal wirings, the metal wirings being arranged on the cell array and extending in the column direction in correspondence to a plurality of columns, and each of the bit lines being commonly connected to the drain regions of the memory cells on a corresponding column; and a plurality of main source lines formed of metal wirings, the main source lines being arranged intermittently between the columns of the bit lines on the cell array and extending in the column direction, and each of the main source lines being commonly connected to the local source lines, in which the method comprising:

forming a gate insulating film on a well region formed on a surface layer of a silicon substrate;

forming a first electrode layer for a floating gate on the gate insulating film;

selectively removing the first electrode layer, the gate insulating film, and the well region to form a groove for an element isolation region in a self-align with the first electrode layer;

embedding an element isolation film in the groove for an element isolation region;

etching a portion of the element isolation film in the groove, which is under a local source line to be later formed, so that a height of the element isolation film or a height of a portion of the element isolation film contacting the semiconductor substrate is lower than an upper surface of a source region to be formed at a later step under the local source line;

forming a further first electrode layer over the substrate;

forming a cell slit in the further first electrode layer on the element isolation region to separate the floating gates on the element isolation region;

etching the element isolation film of the element isolation region under the cell slit to form a deep slit in the element isolation film of the element isolation region under the cell slit to extend to a depth deeper than the well region;

forming an inter-gate insulating film over the semiconductor substrate;

forming a second electrode layer over the inter-gate insulating film;

forming a gate processing pattern on the second electrode layer, and by using the gate processing pattern as a mask, patterning the second electrode layer, the inter-gate insulating film, and the first electrode layer to form a control gate line and a floating gate separated each memory cell;

forming a drain region and a source region of a memory cell;

forming an interlayer insulating film over the substrate;

forming a bit line contact hole and a local source line embedding groove in the interlayer insulating film, the bit line contact hole being formed on the drain regions of memory cells on a same column in the cell array, and the local source line embedding groove being formed to extend in a row direction over the source regions of the memory cells on a same row and the element isolation regions between the columns of the memory cells of the cell array;

etching the element isolation film of the element isolation region under the deep slit to the well region; and depositing metal over the semiconductor substrate to embed the metal in the bit line contact hole and the local source line embedding groove to form the bit line and the local source line which is electrically connected to the well region.

BRIEF DESCRIPTION OF THE SEVERAL VIEWS OF THE DRAWING

FIG. 22 is a schematic cross sectional view of the portion of the cell array, for explaining the method of manufacturing the NOR type flash memory according to the first embodiment of the present invention.

FIG. 23 is a schematic cross sectional view of the portion of the cell array, for explaining the method of manufacturing the NOR type flash memory according to the first embodiment of the present invention.

FIG. 28 is a schematic cross sectional view of the portion of the cell array, for explaining the method of manufacturing the NOR type flash memory according to the first embodiment of the present invention.

FIG. 29 is a schematic cross sectional view of the portion of the cell array, for explaining the method of manufacturing the NOR type flash memory according to the first embodiment of the present invention.

FIG. 40 is a partial perspective view showing an electronic card using a NOR type flash memory according to a third embodiment of the present invention and a digital still camera as one example of an electronic apparatus using the electronic card.

DETAILED DESCRIPTION OF THE INVENTION

First Embodiment

In a first embodiment of the present invention, a structure of a cell array which has a local interconnect wiring using, for example, tungsten (W), as a local source line in an array of a NOR type flash memory cell carrying out channel erasing and channel hot electron writing, and a method of manufacturing the cell array, are explained.

Figure 1:
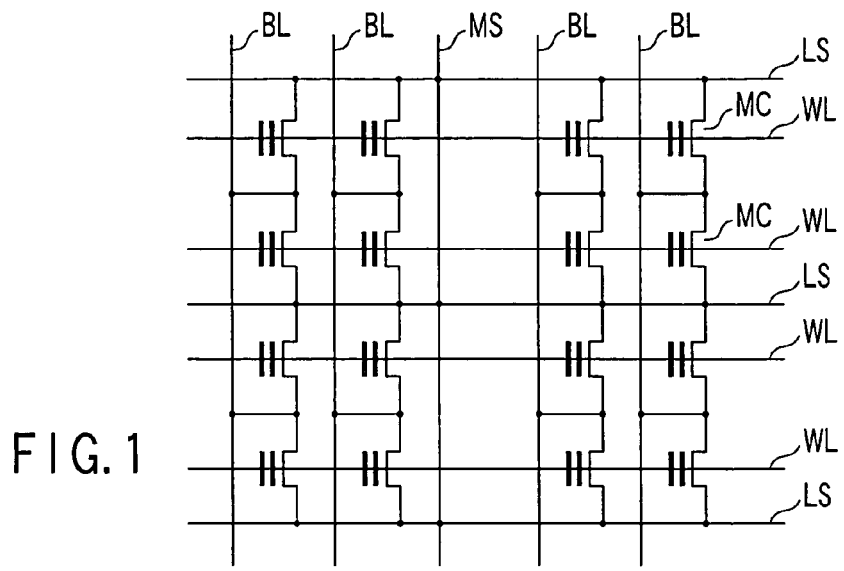
FIG. 1 is a circuit diagram showing a part of a cell array of a NOR type flash memory.
Figure 2:
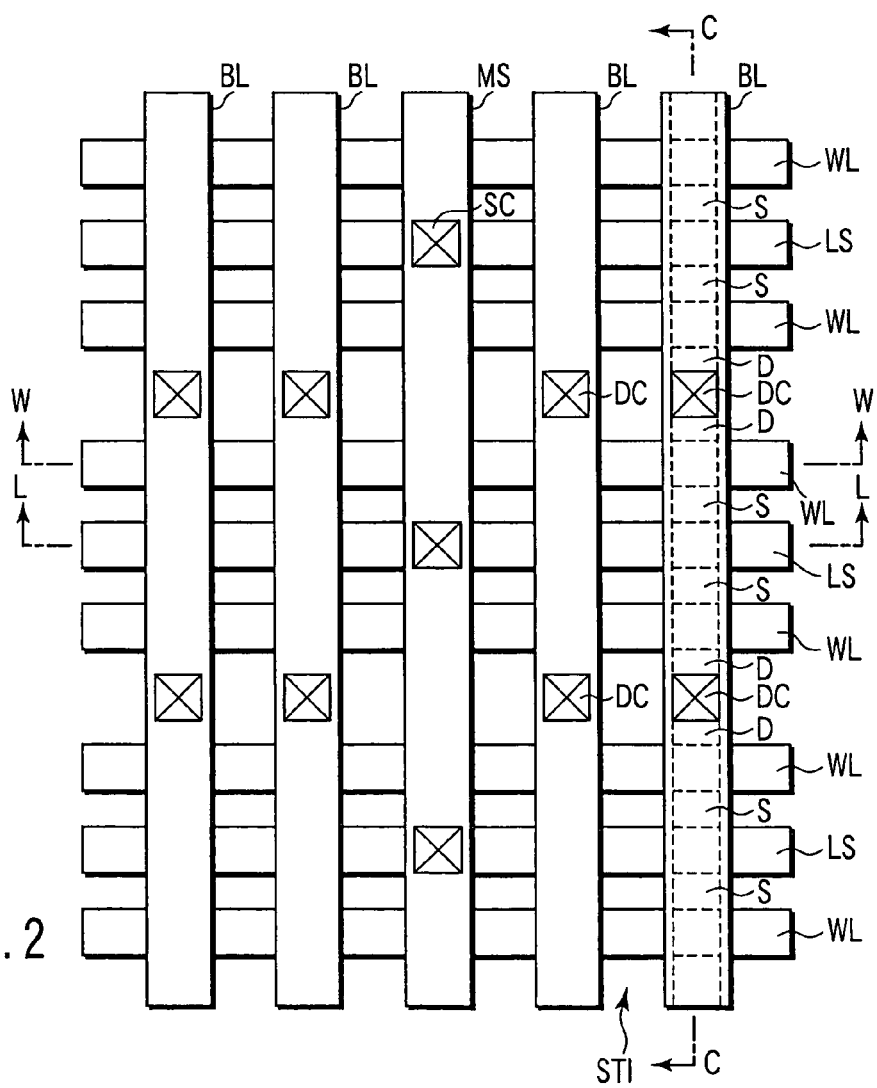
FIG. 2 is a layout diagram showing a part of a cell array of a NOR type flash memory.

FIG. 1 shows an equivalent circuit of a part of a cell array of a NOR type flash memory of a floating gate structure. FIG. 2 shows a layout of the cell array of the NOR type flash memory in FIG. 1.

The NOR type cell array shown in FIGS. 1 and 2 is formed of a plurality of memory cells MC arranged in a matrix form in a well region formed in a surface layer of a semiconductor substrate. Each of the memory cells MC comprises a cell transistor. The cell transistor comprises an active region (i.e., impurity diffusion layers for source/drain and a channel layer) formed in the well region, and a two-layer gate structure (i.e., a structure in which a control gate is formed on a floating gate via an inter-gate insulating film) via an gate insulating film on the well region.

In the above-described NOR type cell array, two adjacent memory cells in a column direction combine to form a set of memory cells, and the two adjacent memory cells share a drain region D. Two adjacent sets of the two adjacent memory cells in the column direction share a source region S. Columns of the memory cells are separated from each other by a shallow trench type isolation (STI) region.

A plurality of word lines WL are arranged on the cell array in a row direction. Each of the word lines WL is commonly connected to control gate electrodes of the memory cells on a corresponding row.

A plurality of local source lines LS are arranged on the cell array in the row direction. Each of the local source lines LS is formed of a metal wiring layer and commonly connected to the shared source regions S of the memory cells on a corresponding row.

Further, a plurality of bit lines BL, which are formed of metal wiring layers and thus low in resistance, are arranged on the cell array in the column direction. Each of the bit lines BL is commonly connected to the shared drain regions D of the memory cells on a corresponding column.

A plurality of main source lines MS, which are formed of metal wiring layers and thus low in resistance, are intermittently arranged in the column direction between the arrangements of the bit lines BL, although in FIGS. 1 and 2, only one main source line MS is shown. Each of the main source lines MS is commonly connected to the plurality of local source lines LS.

As described above, the drains D of the same column, each shared by the two memory cells forming a memory cell set in the column direction, are commonly connected to the low resistance bit line BL via drain contacts DC. Further, the sources S, each shared by adjacent two sets of memory cells in the column direction, are connected to the local source line LS extending in parallel to and between two adjacent word lines WL. The local source line LS is connected to the main source MS of a low resistance via a source line contact SC, and is supplied with an electric potential from the outside of the cell array.

In the NOR type flash memory having the above-described structure, when an electron injection is carried out to inject electrons into a floating gate by using a channel hot electron injection to write data into the cell, ground potential is applied to the source S and the well region of the cell. Further, predetermined potentials by which the efficiency of generating hot electrons is made maximum are applied to the control gate and the drain D via a word line WL and a bit line BL, respectively, from an external circuit.

Figure 24:
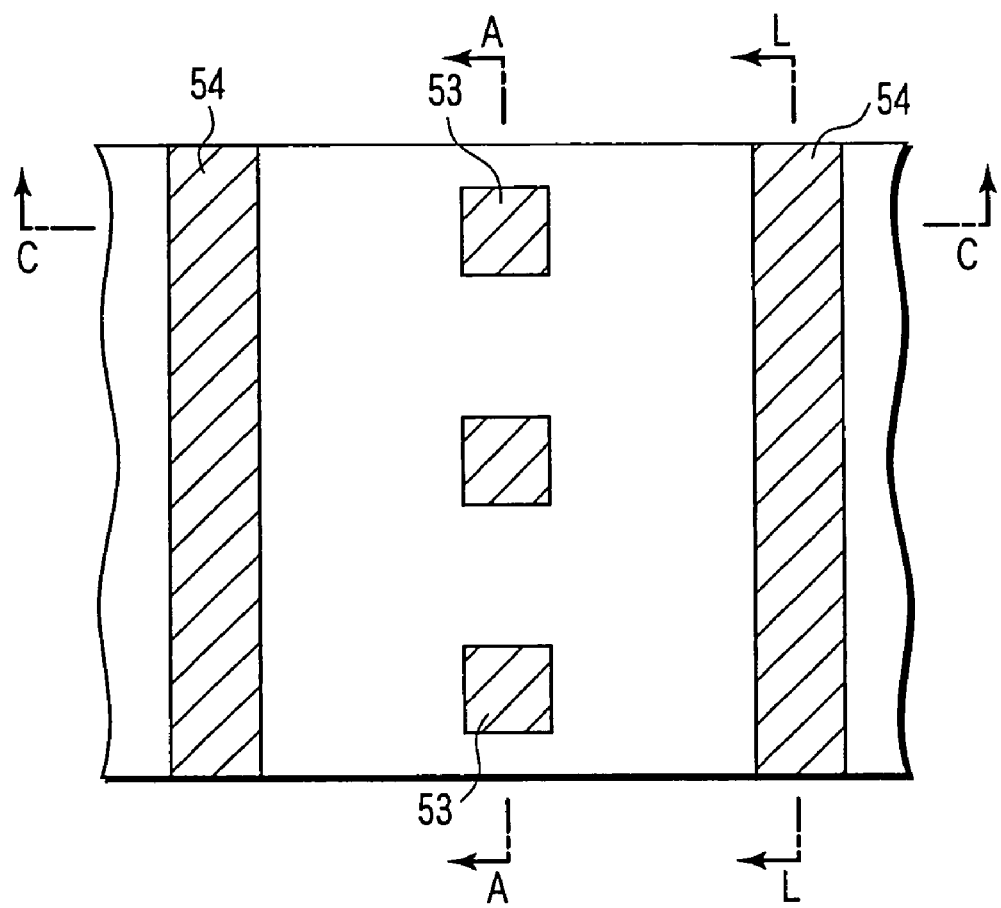
FIG. 24 is a plan view schematically showing a pattern layout viewed from the top of FIG. 23.

FIGS. 3 to 23 and FIGS. 25 to 30 are schematic cross sectional views of device structures in steps of manufacturing the NOR type flash memory according to the first embodiment of the present invention. FIG. 24 is a plan view schematically showing a pattern layout viewed from the top of FIG. 23.

Hereinafter, the manufacturing processes will be described, mainly focusing on the cross-sections of the cell region and the peripheral region (peripheral transistor formation region), a W—W line cross-section taken along the word line in the cell region in FIG. 2, an L—L line cross-section taken along the local interconnect wiring (local source-line), a C—C line cross-section taken along the cell column, and an A—A line cross-section taken along the bit line contact column in FIG. 24. The peripheral region includes a low breakdown voltage region at which peripheral transistors with low breakdown voltages are formed, and a high breakdown voltage region at which peripheral transistors with high breakdown voltages are formed.

Figure 3:
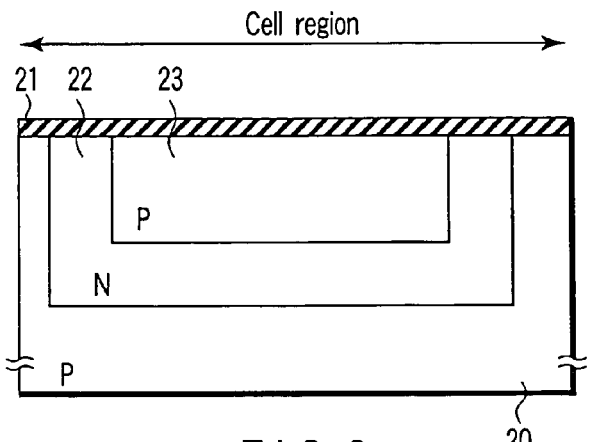
FIG. 3 is a schematic cross sectional view of a portion of a cell array, for explaining a method of manufacturing a NOR type flash memory according to a first embodiment of the present invention.
Figure 4:
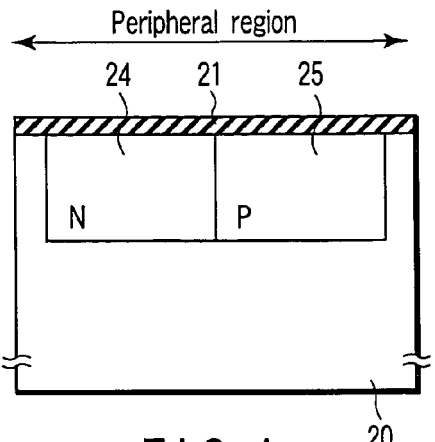
FIG. 4 is a schematic cross sectional view of the portion of the cell array, for explaining the method of manufacturing the NOR type flash memory according to the first embodiment of the present invention.

First, as shown in FIGS. 3 and 4, a pad oxide film 21 is formed so as to be 5 nm to 25 nm on the surface of a semiconductor substrate 20 by thermal oxidation method or the like. In the present embodiment, a P-type silicon substrate is used as the semiconductor substrate. Then, desired patterns of photoresist (hereinafter referred to as resist pattern) are formed by photolithography, and ion implantations are carried out via the pad oxide film 21, by using the resist patterns as masks, to form a deep N well 22 and a P well 23 at the cell region and an N well 24 and a P well 25 at the peripheral region. Then, channel ion implantation for adjusting a threshold voltage value is carried out.

Figure 5:
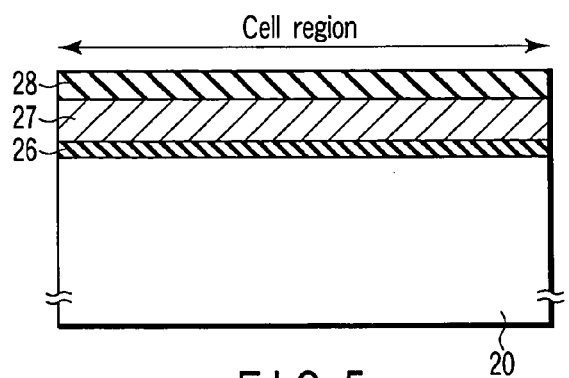
FIG. 5 is a schematic cross sectional view of the portion of the cell array, for explaining the method of manufacturing the NOR type flash memory according to the first embodiment of the present invention.
Figure 6:
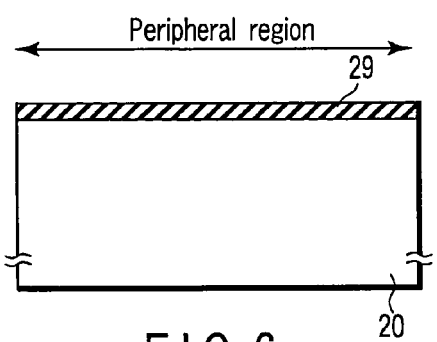
FIG. 6 is a schematic cross sectional view of the portion of the cell array, for explaining the method of manufacturing the NOR type flash memory according to the first embodiment of the present invention.

Next, the pad oxide film 21 is removed, and as shown in FIGS. 5 and 6, a tunnel oxide film 26 of the cell is formed so as to be, for example, 5 nm to 10 nm, and then, a polycrystalline silicon 27 which is processed to be a floating gate of the cell at a later step is deposited. Further, a nitride film 28 for blocking oxidation is deposited so as to be, for example, 70 nm.

Next, the cell region is covered with a resist pattern (not shown). By using the resist film as a mask, the nitride film 28 and the polycrystalline silicon 27 on the peripheral region are removed by a dry etching method, and further, the tunnel oxide film 26 on the peripheral region is removed by wet etching. Thereafter, a first gate oxide film 29 is formed so as to have a predetermined film thickness within a range of, for example, 10 nm to 30 nm on the substrate at the peripheral region by thermal oxidation. At this time, since the polycrystalline silicon 27 formed on the cell region is blocked by the nitride film 28 formed on the surface of polycrystalline silicon 27, there is no case in which the polycrystalline silicon 27 is oxidized.

Figure 7:
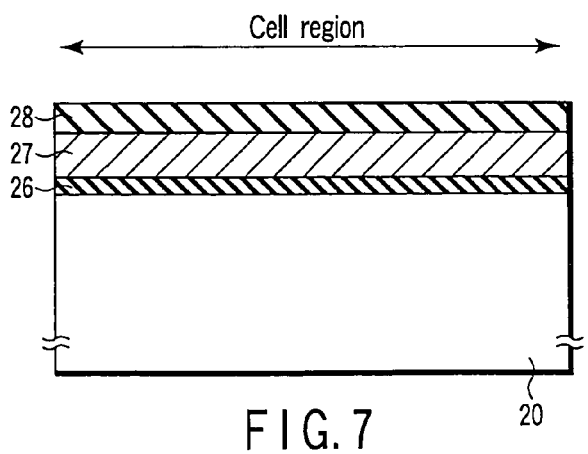
FIG. 7 is a schematic cross sectional view of the portion of the cell array, for explaining the method of manufacturing the NOR type flash memory according to the first embodiment of the present invention.
Figure 8:
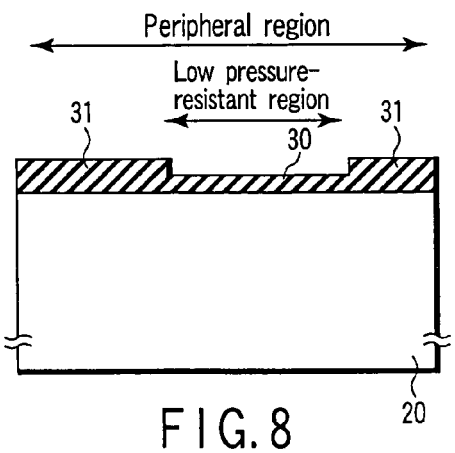
FIG. 8 is a schematic cross sectional view of the portion of the cell array, for explaining the method of manufacturing the NOR type flash memory according to the first embodiment of the present invention.

Next, part of the peripheral region, which is other than the low breakdown voltage region, is covered with a resist pattern (not shown). By using the resist film as a mask, the first gate oxide film 29 on the low breakdown voltage region is removed by wet etching. Then, the above-described resist pattern is removed, and a thermal oxidation is carried out. As a result, as shown in FIG. 8, a second gate oxide film 30 of a peripheral transistor of a low breakdown voltage is formed on the low breakdown voltage region so as to be, for example, 3 to 7 nm. At this time, part of the peripheral region, which is other than the low breakdown voltage region, i.e., the high breakdown voltage region becomes a gate oxide film 31 in which the second gate oxide film 30 is deposited on the first gate oxide film 29. The gate oxide film 31 becomes a gate oxide film of a peripheral transistor of a high breakdown voltage. At this process, as shown in FIG. 7, the layer structure on the cell region is not changed, and is the same as that shown in FIG. 5.

Figures 9, 10:
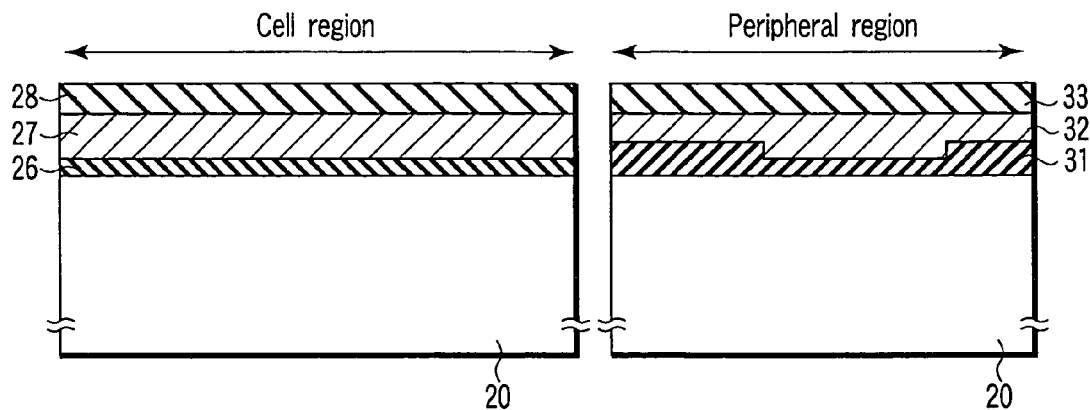
FIG. 9 is a schematic cross sectional view of the portion of the cell array, for explaining the method of manufacturing the NOR type flash memory according to the first embodiment of the present invention.
FIG. 10 is a schematic cross sectional view of the portion of the cell array, for explaining the method of manufacturing the NOR type flash memory according to the first embodiment of the present invention.

Next, as shown in FIGS. 9 and 10, a polycrystalline silicon 32 and a nitride film 33 are successively deposited over the semiconductor substrate, and thereafter, a desired resist pattern (not shown) is formed. The nitride film 33 and the polycrystalline silicon 32 on the cell region are removed by dry etching, by using the resist pattern as a mask. At this time, the polycrystalline silicon 32 is made to have the same film thickness as the polycrystalline silicon 27 on the cell region, and the nitride film 33 is made to have the same film thickness as the nitride film 28 on the cell region.

Figure 11:
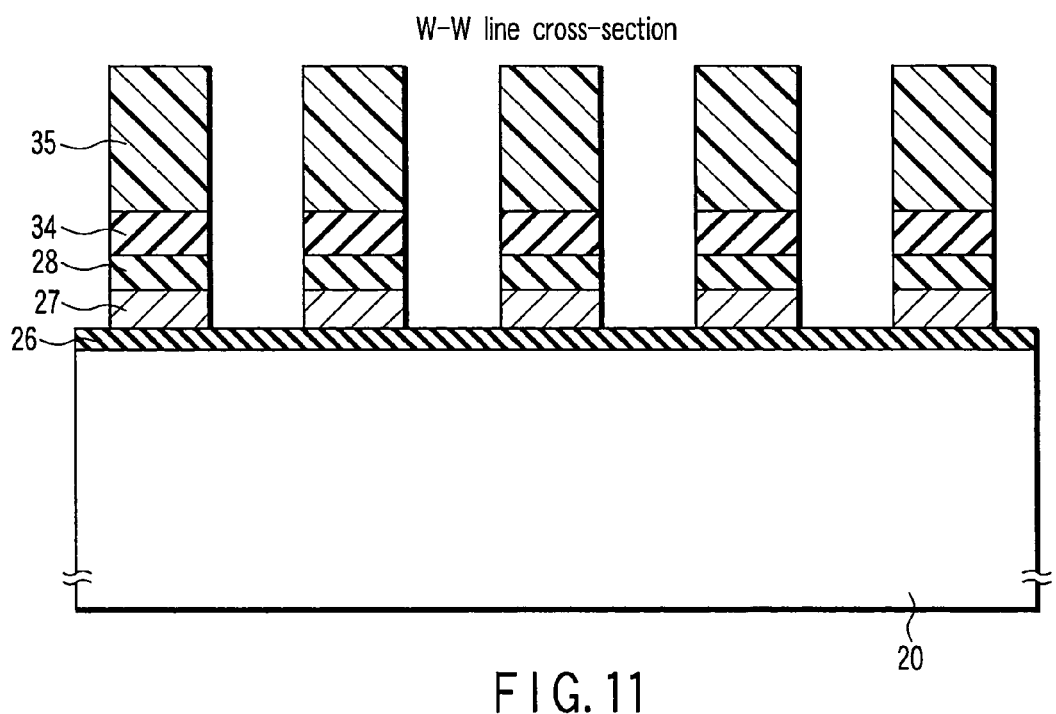
FIG. 11 is a schematic cross sectional view of the portion of the cell array, for explaining the method of manufacturing the NOR type flash memory according to the first embodiment of the present invention.

Next, as shown in FIG. 11 which shows the W—W line cross-section, a TEOS group oxide film 34 is deposited over the semiconductor substrate to have a film thickness of 100 nm to 250 nm, and thereafter, a desired resist pattern 35 for patterning the active region of the cell region is formed. Then, the oxide film 34, the nitride film 28, and the polycrystalline silicon 27 are successively removed by dry etching, by using the resist pattern 35 as a mask.

Subsequently, by removing the resist pattern 35, the oxide film 34, the nitride film 28, and the polycrystalline silicon 27, which have the same pattern as the resist pattern 35 are formed on the active region.

Figure 12:
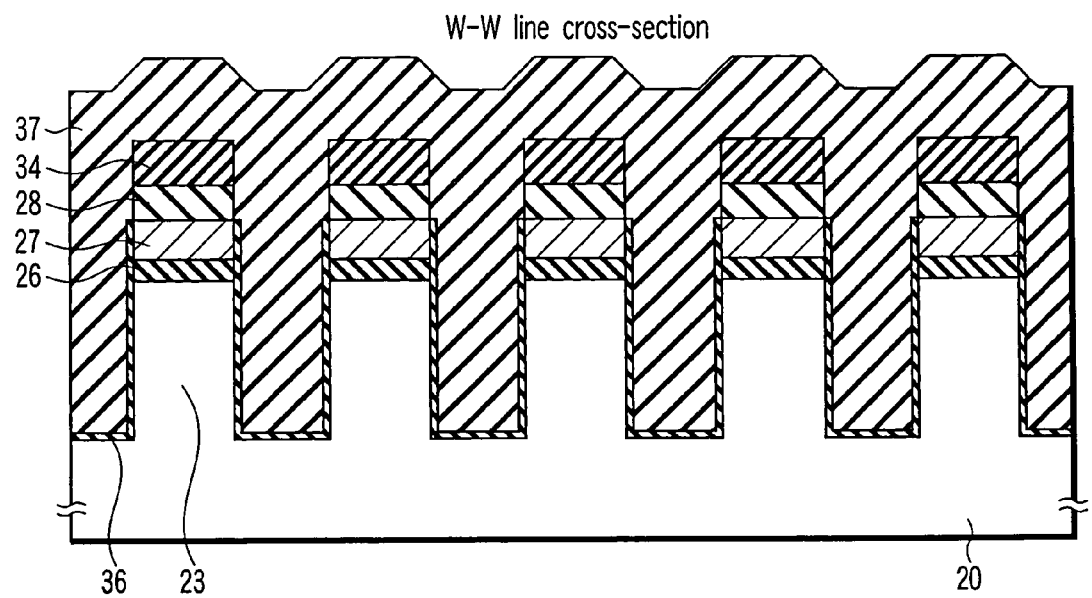
FIG. 12 is a schematic cross sectional view of the portion of the cell array, for explaining the method of manufacturing the NOR type flash memory according to the first embodiment of the present invention.

Next, as shown in FIG. 12 which shows the W—W line cross-section, by using the multi-layer film of the oxide film 34, the nitride film 28, and the polycrystalline silicon 27 as a hard mask, a groove for an element isolation region is formed by carrying out etching onto the oxide film 26 and the P well 23 on the cell region by an RIE method, and thereafter, an oxide film 36 of 2 nm to 4 nm is formed by thermal oxidation or the like.

Next, a material is deposited such that it is embedded in the groove for the element isolation region to form an oxide film 37 in the groove. At this time, the deposition of the material forming the oxide film 37 is carried out under the condition that, for example, an SiH$_4$ film is embedded to sufficiently cover the inside of the groove for the element isolation region up to the multi-layered film of the oxide film 34, the nitride film 28, and the polycrystalline silicon 27, which are used as the masks, by a high density plasma (High Density Plasma; HDP) method.

Figure 13:
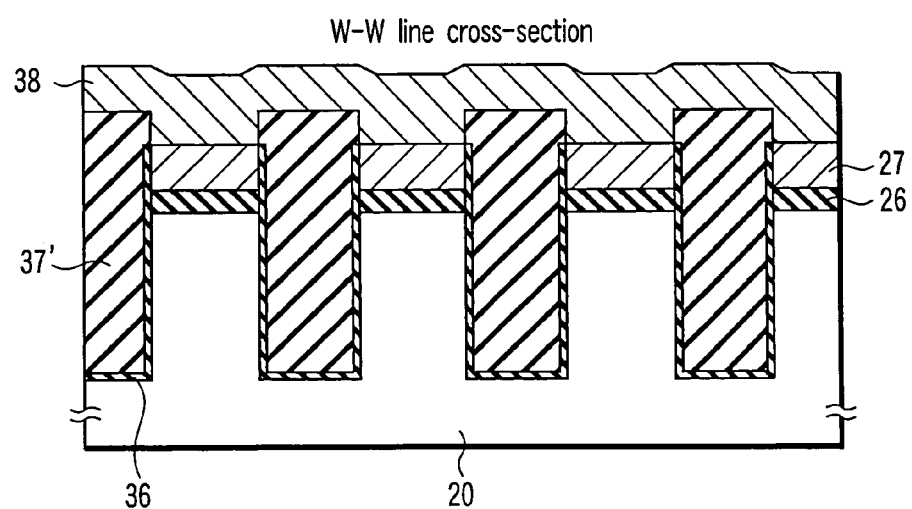
FIG. 13 is a schematic cross sectional view of the portion of the cell array, for explaining the method of manufacturing the NOR type flash memory according to the first embodiment of the present invention.

Then, by polishing the embedded oxide film 37 and the oxide film 34 by using the nitride film 28 as a stopper, by a chemical mechanical polishing (CMP) method, the embedded oxide film 37 is flattened. As a result, an STI region 37' is formed, as shown in FIG. 13 which shows the W—W line cross-section (cell region). Next, the nitride film 28 (FIG. 12) is removed by wet etching with hot phosphoric acid or the like, and thereafter, as shown in FIG. 13, a phosphorus doped polycrystalline silicon 38 is deposited. The phosphorus doped polycrystalline silicon 38 is processed to be a floating gate of the cell at a later step.

Figure 14:
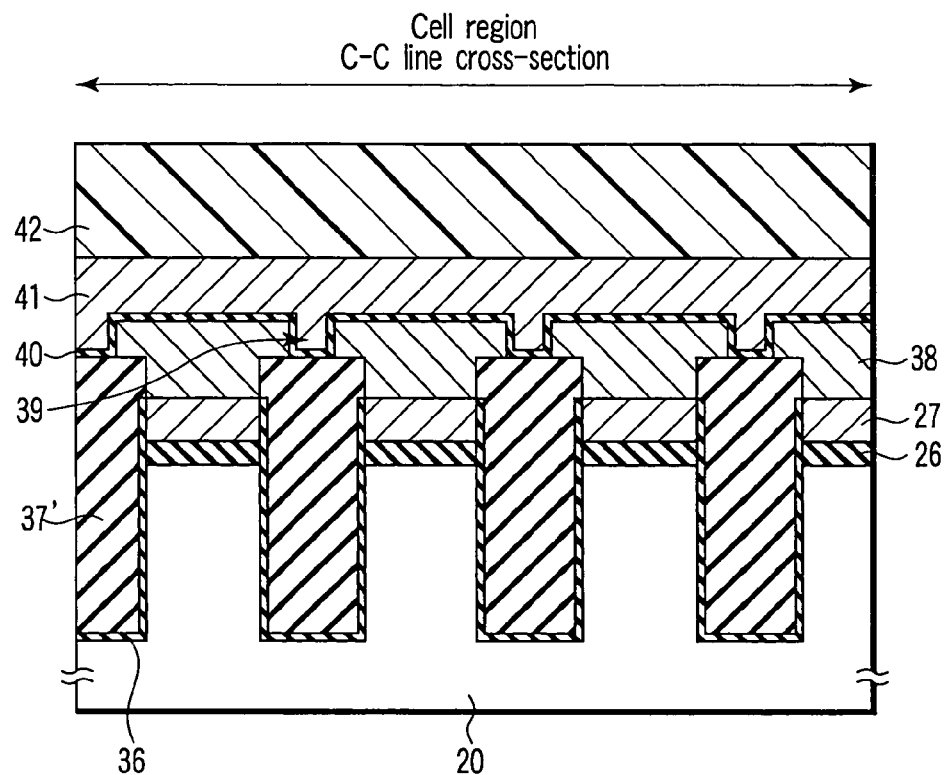
FIG. 14 is a schematic cross sectional view of the portion of the cell array, for explaining the method of manufacturing the NOR type flash memory according to the first embodiment of the present invention.
Figure 15:
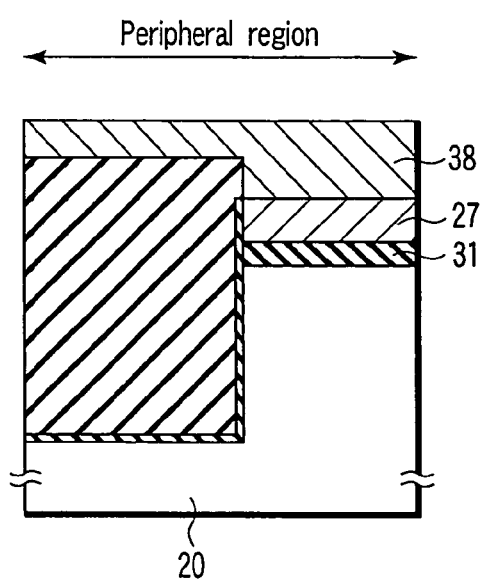
FIG. 15 is a schematic cross sectional view of the portion of the cell array, for explaining the method of manufacturing the NOR type flash memory according to the first embodiment of the present invention.

Next, as shown in FIG. 14 which shows the W—W line cross-section, in order to form a floating gate of the cell, a desired resist pattern (not shown) is formed, and a dry etching is carried out by using the resist pattern as a mask to form cell slits 39 in the polycrystalline silicon 38 on the STI regions 37 so as to separate the polycrystalline silicon 38 on the STI regions 37. Thereafter, the above-described resist pattern is removed, and an ONO insulating film 40 composed of an deposited film of, for example, an oxide film/a nitride film/an oxide film is formed over the substrate as an inter-gate insulating film, and subsequently a polycrystalline silicon 41 is deposited over the ONO insulating film 40. The polycrystalline silicon 41 is processed to be a control gate of the cell at a later step. Then, the cell region is covered with a resist pattern 42, and as shown in FIG. 15, the polycrystalline silicon 41 and the ONO insulating film 40 on the peripheral region are removed by a dry etching method.

Figure 16:
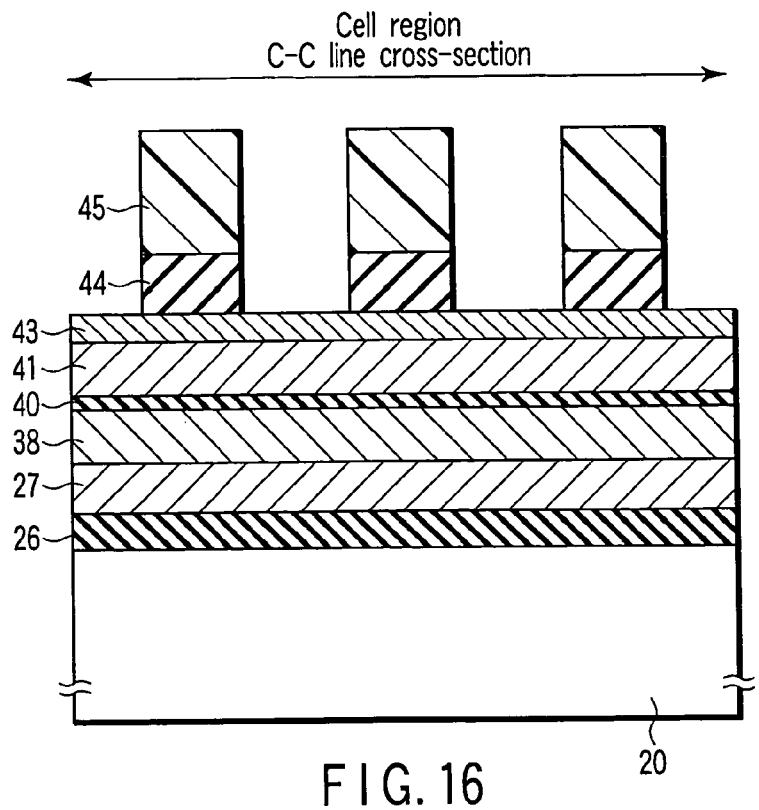
FIG. 16 is a schematic cross sectional view of the portion of the cell array, for explaining the method of manufacturing the NOR type flash memory according to the first embodiment of the present invention.
Figure 17:
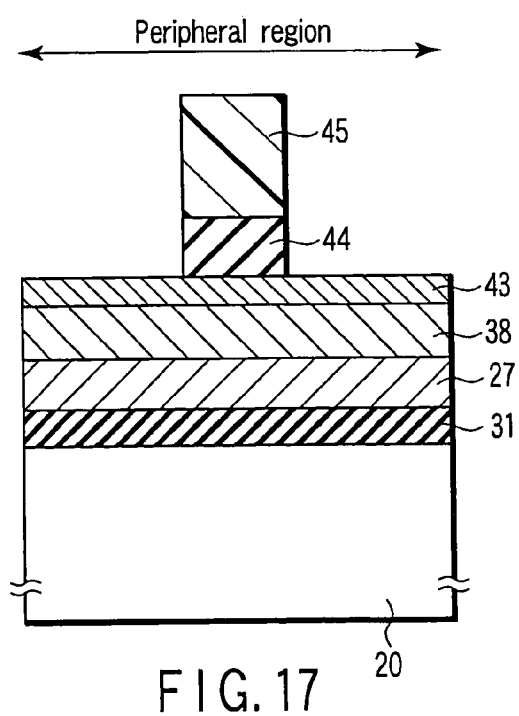
FIG. 17 is a schematic cross sectional view of the portion of the cell array, for explaining the method of manufacturing the NOR type flash memory according to the first embodiment of the present invention.

Next, the above-described resist pattern 42 is removed, and then, as shown in FIG. 16 which shows the C—C line cross-section, and as shown in FIG. 17, a tungsten silicide (WSi) film 43 is deposited over the substrate so as to have a thickness of, for example, 100 nm, and next, a TEOS group oxide film 44 is deposited over the tungsten silicide film 43 so as to have a thickness of, for example, 25 nm. At a later step, the TEOS group oxide film 44 is processed to be a hard mask used at the time of processing the gate electrode. Subsequently, in order to form the gates of the cells and the gates of the peripheral transistors, a desired resist pattern 45 is formed. By using the resist pattern 45 as a mask, the TEOS group oxide films 44 is patterned into a hard mask 44 by a dry etching method.

Figure 18:
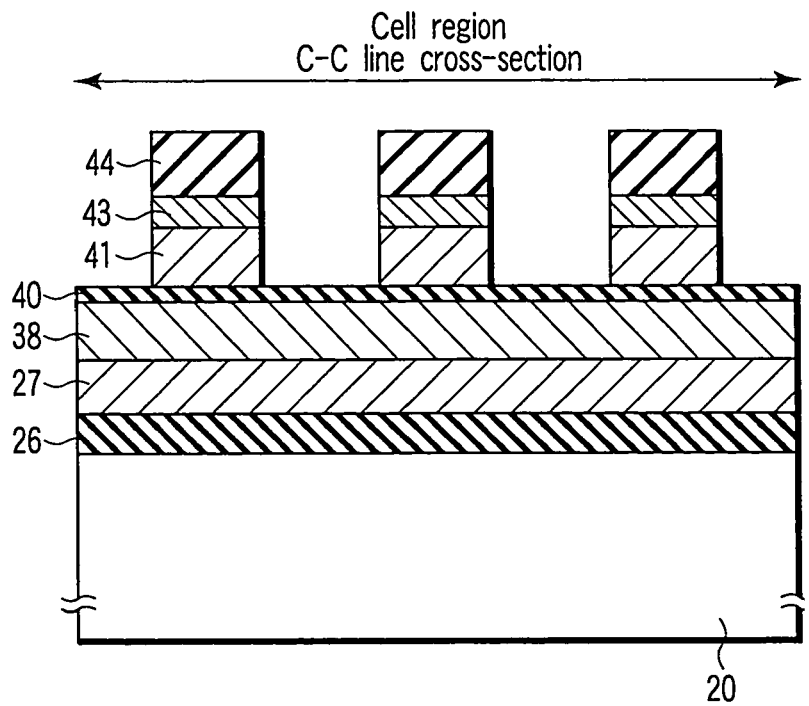
FIG. 18 is a schematic cross sectional view of the portion of the cell array, for explaining the method of manufacturing the NOR type flash memory according to the first embodiment of the present invention.
Figure 19:
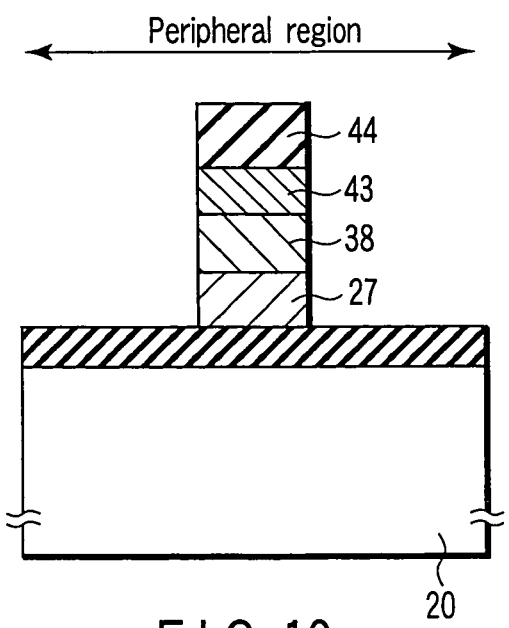
FIG. 19 is a schematic cross sectional view of the portion of the cell array, for explaining the method of manufacturing the NOR type flash memory according to the first embodiment of the present invention.

Next, as shown in FIG. 18 which shows the C—C line cross-section, and as shown in FIG. 19, the WSi film 43, the polycrystalline silicon 38, and polycrystalline silicon 27 at the peripheral region and the WSi film 43 and the polycrystalline silicon 41 at the cell region are removed by dry etching, by using the hard masks 44. At this time, the ONO film 40 on the cell region serves as an etching stopper.

Figure 20:
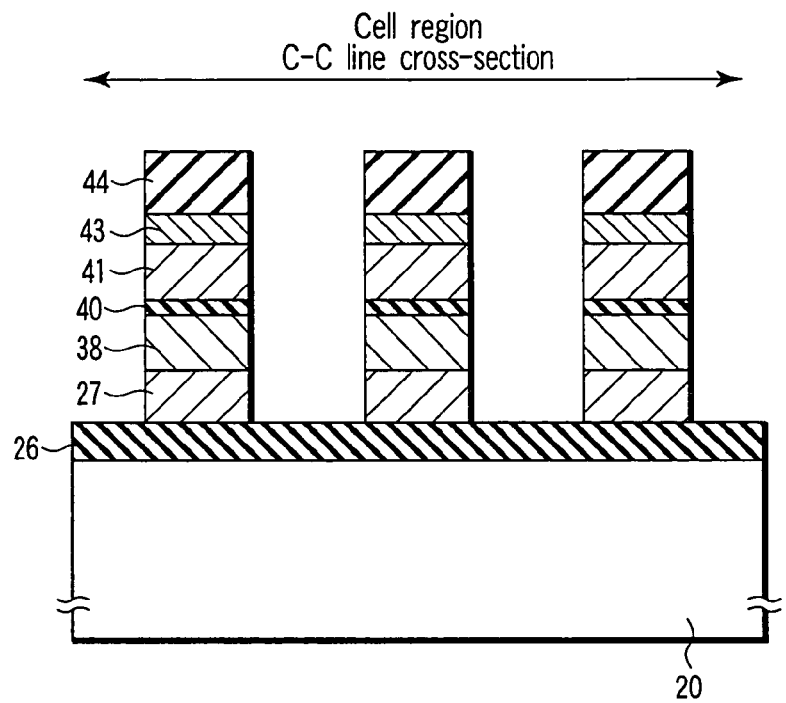
FIG. 20 is a schematic cross sectional view of the portion of the cell array, for explaining the method of manufacturing the NOR type flash memory according to the first embodiment of the present invention.
Figure 21:
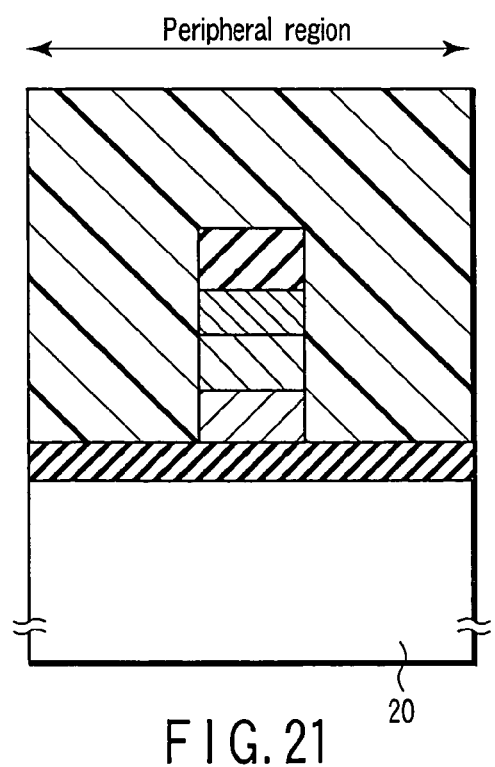
FIG. 21 is a schematic cross sectional view of the portion of the cell array, for explaining the method of manufacturing the NOR type flash memory according to the first embodiment of the present invention.

Next, as shown in FIG. 20 which shows the C—C line cross-section, and as shown in FIG. 21, in order to form the multi-layer gate structure of the cell, a photo resist is coated and processed to have a predetermined pattern covering the peripheral region and having openings only on the cell region. Next, the ONO film 40, the polycrystalline silicon 38, and polycrystalline silicon 27 at the cell region are removed by dry etching, by using the hard masks 44.

Next, as shown in FIG. 22 which shows the C—C line cross-section, oxide films 46 having a desired thickness are formed at the side surfaces of the WSi film 43, and the polycrystalline silicon films 41, 38, and 27, which form the gate, by carrying out oxidation. Thereafter, in order to form the cells and the peripheral transistors so as to have a lightly doped drain (LDD) structure, ion implantation is carried out to form N diffusion layers 47 of a low concentration at the cells and the peripheral transistors. Next, nitride films are deposited so as to have a desired thickness, and etched back to be formed into side wall spacers 48. Thereafter, ion implantation is carried out to form high-density N⁺ diffusion layers 49 of the cells and the peripheral transistors.

Next, as shown in FIG. 23 which shows the C—C line cross-section, a barrier nitride film 50 is deposited, and then a boron phosphorus silicate glass (BPSG) film 51 is deposited over the barrier nitride film 50. The barrier nitride film 50 functions as a stopper at the time of opening contact, and the boron phosphorus silicate glass film 51 is an interlayer insulating film. Then, reflow of the BPSG film 51 is carried out, and thereafter, the BPSG film 51 is flattened by polishing, by using a CMP method. Thereafter, a TEOS group oxide film 52 is deposited.

Then, a desired resist pattern as shown in FIG. 23 is formed, and, by using the resist pattern as a mask and by using the barrier nitride film 50 as a stopper, the TEOS group oxide film 52 and the BPSG film 51 are selectively removed by a dry etching method. As a result, a bit line contact hole 53 on the drain of the cell, local interconnect wiring groove 54, and contact holes (not shown) of the peripheral transistors are formed. The local interconnect extends over the STI regions and forms a local source line connecting the sources of the plurality of cells.

Figure 25:
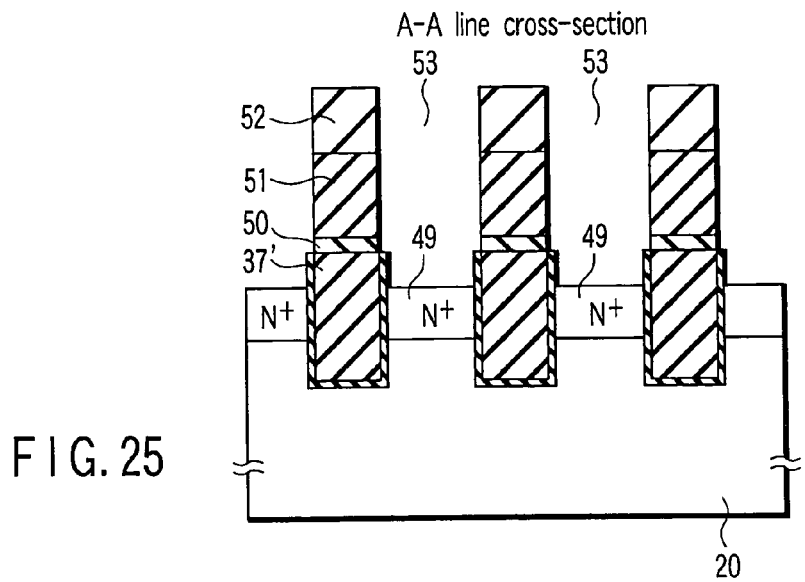
FIG. 25 is a schematic cross sectional view of the portion of the cell array, for explaining the method of manufacturing the NOR type flash memory according to the first embodiment of the present invention.
Figure 26:
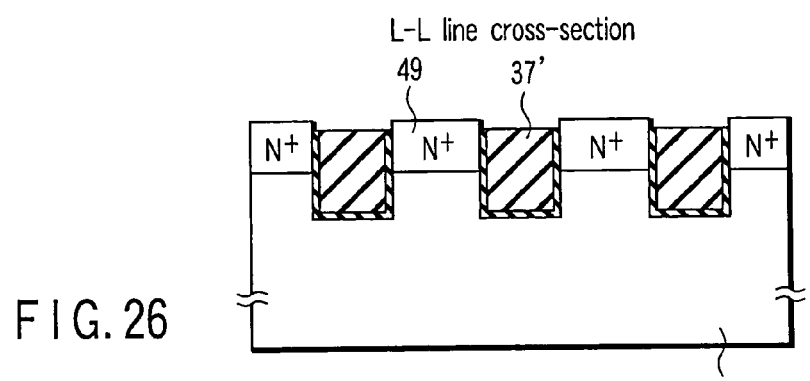
FIG. 26 is a schematic cross sectional view of the portion of the cell array, for explaining the method of manufacturing the NOR type flash memory according to the first embodiment of the present invention.
Figure 30:
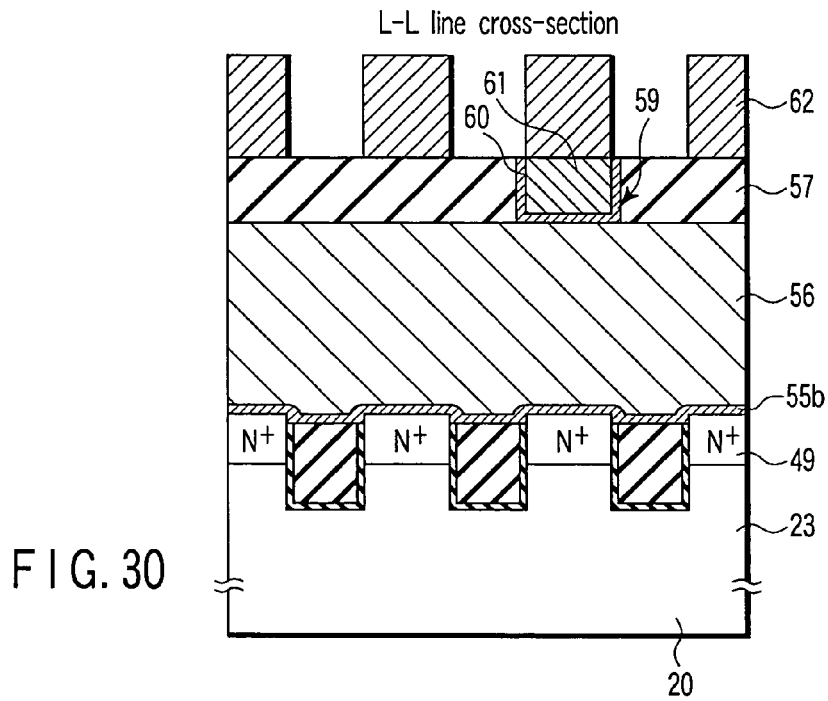
FIG. 30 is a schematic cross sectional view of the portion of the cell array, for explaining the method of manufacturing the NOR type flash memory according to the first embodiment of the present invention.

FIG. 24 shows a layout of the top of FIG. 23. The C—C line cross-section in FIG. 24, along the cell column, is shown in FIG. 23. The L—L line cross-section in FIG. 24, along the local interconnect wiring contact column, is shown in FIGS. 26, 28, and 30, and the A—A line cross-section in FIG. 24, along the bit line contact column, is shown in FIGS. 25, 27, and 29.

Next, the resist pattern (FIG. 23) is removed, and thereafter, the barrier nitride films 50 at the bottom portion of the bit line contact hole 53 and the bottom portion of the local interconnect wiring groove 54 are removed by dry etching, and portions of the Si substrate, which are at the bit line contact portion and the local interconnect wiring groove portions, are exposed.

At this time, as shown in FIG. 24, in a pattern (a rectangular pattern) such as the local interconnect wiring groove 54 whose opening area is larger than that of the bit line contact hole 53, if processing is carried out under the condition that the selectivity of the nitride film 50 and the oxide films 52 and 37', not shown in FIG. 24, is lowered, etching for the TEOS group oxide film 52 and the STI film 37', not shown in FIG. 24, is advanced. As a result, as shown in FIG. 25 which shows the A—A line cross-section, the STI regions 37' are not etched out at the bit line contact hole portions, while as shown in FIG. 26 which shows the L—L line cross-section, the STI regions 37' is etched out at the local interconnect wiring groove portions to a position lower than the surface of the Si substrate.

Figure 27:
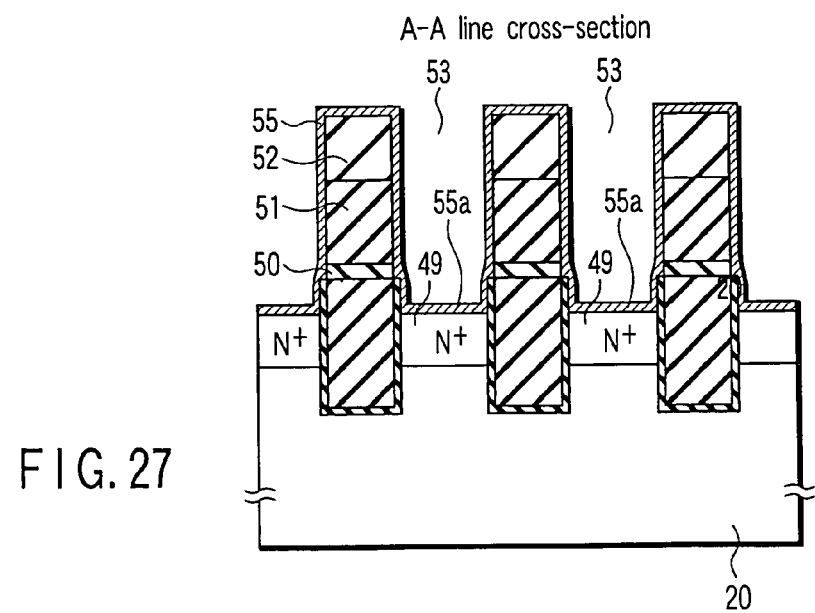
FIG. 27 is a schematic cross sectional view of the portion of the cell array, for explaining the method of manufacturing the NOR type flash memory according to the first embodiment of the present invention.

Next, as shown in FIG. 27 which shows the A—A line cross-section and as shown in FIG. 28 which shows the L—L line cross-section, a Ti film/TiN film 55 which functions as a barrier metal is deposited by a spattering method.

By the way, the solid angle is small at the bottom portion of the bit line contact hole 53, and on the other hand, the solid angle is large at the bottom portion of the local interconnect wiring groove 54 having a rectangular pattern whose opening area is large. The film thickness of a Ti/TiN film 55a deposited on the Si substrate at the bottom portion of the bit line contact hole 53 and the film thickness of a Ti/TiN film 55b deposited on the Si substrate at the bottom portion of the local interconnect wiring groove 54 depend on the solid angle between the Ti/TiN film 55a and the bottom portion of the Si substrate and the solid angle between the Ti/TiN film 55b and the bottom portion of the Si substrate, respectively. Utilizing the dependency, it is possible to deposit the Ti/TiN film 55a at the bottom portion of the bit line contact hole 53 to be thin, and deposit the Ti/TiN film 55b at the bottom portion of the local interconnect wiring groove 54 to be thick.

The thickness of the Ti film of the barrier metal Ti film/TiN film 55 is adjusted within a range of, for example, 10 nm to 50 nm, so that it is possible to adjust the Ti silicide film thickness at the bottom portion of the bit line contact hole 53 to be a film thickness which is sufficiently small in comparison with the layer thickness of the diffusion layer (N⁺ drain diffusion layer) 49 of the cell, and on the other hand, it is possible to adjust the Ti silicide film thickness at the bottom portion of the local interconnect wiring groove 54 to be a sufficiently large film thickness reaching the depth of the layer thickness of the diffusion layer (N⁺ source diffusion layer) 49.

Next, as shown in FIG. 29 which shows the A—A line cross-section and as shown in FIG. 30 which shows the L—L line cross-section, a W film 56 serving as a wiring material is deposited and embedded in the bit line contact holes 53 and the local interconnect wiring grooves 54. Thereafter, the exposed portions of the W film 56 and the Ti/TiN film 55 are removed by using CMP.

Next, the TEOS group oxide film 57 is deposited, and then, a desired resist pattern in formed. By using the resist pattern as a mask, via holes 58 for connecting the bit line contact plug formed of the W film 56 and via holes 59 for connecting the local interconnect wiring formed of the W film 56 are formed in the oxide film 57 by dry etching. Subsequently, the via holes 58 and 59 are embedded with a TiN film 60 and a W film 61 by deposition. The TiN film 60 is a barrier metal, and the W film 61 is a wiring material. Next, the exposed portions of the W film 61 and the TiN film 60 are removed by using CMP. Thereafter, a metal wiring layer is deposited, and by patterning the metal wiring layer, a metal wiring (the bit lines BL and the main source line MS in FIG. 2) 62 is formed. Then, an upper wiring layer (not shown) and a passivation layer (not shown) are formed, and further, openings corresponding to pad regions are formed.

With the above-described structure, the silicide layer of the local source line 56 at the bottom portion of the local interconnect wiring groove 54 is deeper than the N⁺ source diffusion layer 49 of the cell, and the local source line 56 is directly connected to the P well 23, so that a satisfactory electrical connection is presented between the local source line 56 and the P well 23. In this case, the silicide layer at the bottom portion of the local interconnect wiring groove 54 is made thick, and on the other hand, the silicide layer at the bottom portion of the bit line contact hole 53 is made thin. As a result, electrical connection can be achieved between the local source line 56 and the P well 23 of the cell, and on the other hand, electrical insulation can be ensured between the drain contact and the P well 23.

First Modified Example of the First Embodiment

Figure 31:
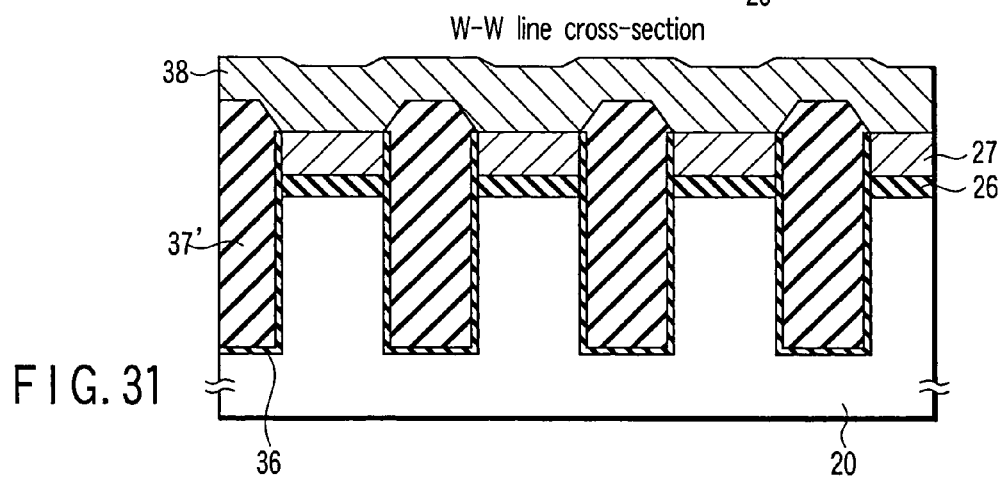
FIG. 31 is a sectional view schematically showing a modified example of the structure shown in FIG. 13.

FIG. 31 shows a first modified example of the structure shown in FIG. 13, in which the shoulder portions of the STI regions 37' are removed (rounded) by applying a wet etching process before depositing the polycrystalline silicon 38. Although FIG. 31 shows the W—W line cross-section, in the L—L line cross-section as well, it is a structure in which the shoulder portions of the STI regions 37 are removed.

Figure 32:
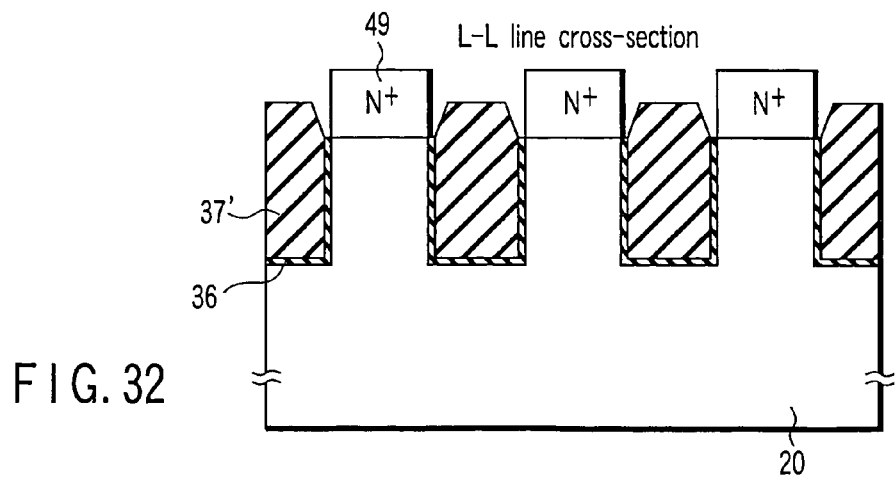
FIG. 32 is a sectional view schematically showing a structure in which the same processes as those shown in FIGS. 14 to 26 are executed to the structure shown in FIG. 31.

FIG. 32 shows a structure in which, with respect to the structure shown in FIG. 31, the shoulder portions of the STI regions 37' are further removed at the local interconnect wiring groove portions by executing the same processes as those shown in FIGS. 14 to 26.

Figure 33:
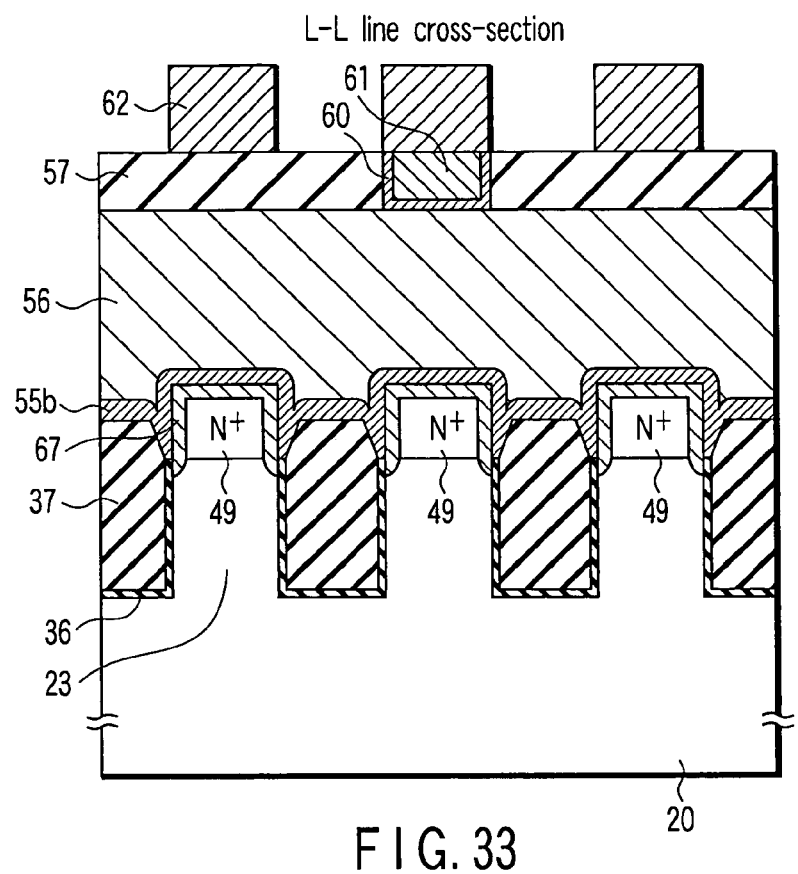
FIG. 33 is a sectional view schematically showing a structure in which the same processes as those shown in FIGS. 27 to 30 are executed to the structure shown in FIG. 32.

FIG. 33 shows an example in which, with respect to the structure shown in FIG. 32, a thick silicide layer 67 is formed, and then, local interconnect wiring 56 is formed by executing the same processes as those shown in FIGS. 27 to 30, so that the local interconnect wiring 56 is electrically connected to the P well in the semiconductor substrate 20.

With the above-described structure, the silicide layer 67 of the local interconnect wiring 56 is deeper than the N+ source diffusion layer 49 of the cell, and the local interconnect wiring 56 is directly electrically connected to the P well 23, so that the electrical connection between the local interconnect wiring 56 and the P well 23 is advanced.

Second Modified Example of the First Embodiment

Figure 34:
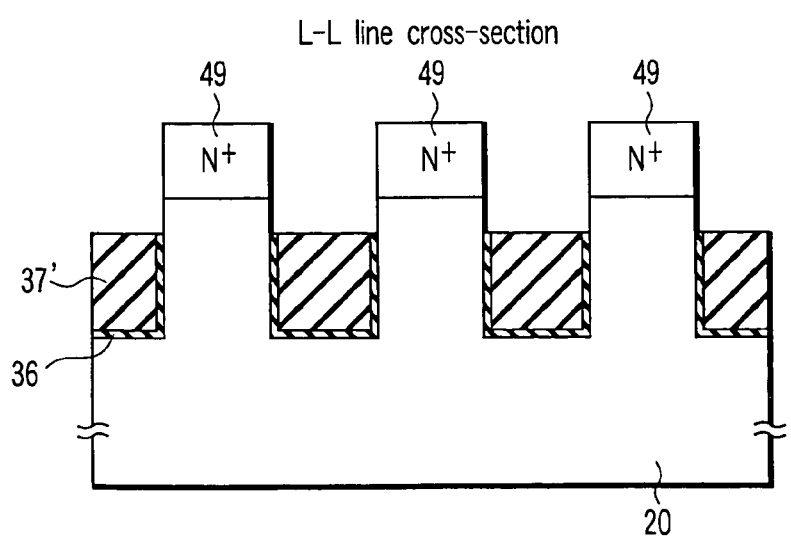
FIG. 34 is a sectional view schematically showing another modified example of the structure shown in FIG. 13.

FIG. 34 shows a second modified example of the structure shown in FIG. 26, in which the depth of the etch-out portion of the STI region 37' at the local interconnect wiring groove portion is made deeper than the bottom portion of the N+ diffusion layer (source diffusion layer) 49 of the cell, by adjusting an etching time of dry etching carried out for the TEOS group oxide film 52, the BPSG film 51, and the barrier nitride film 50 (FIG. 23).

Figure 35:
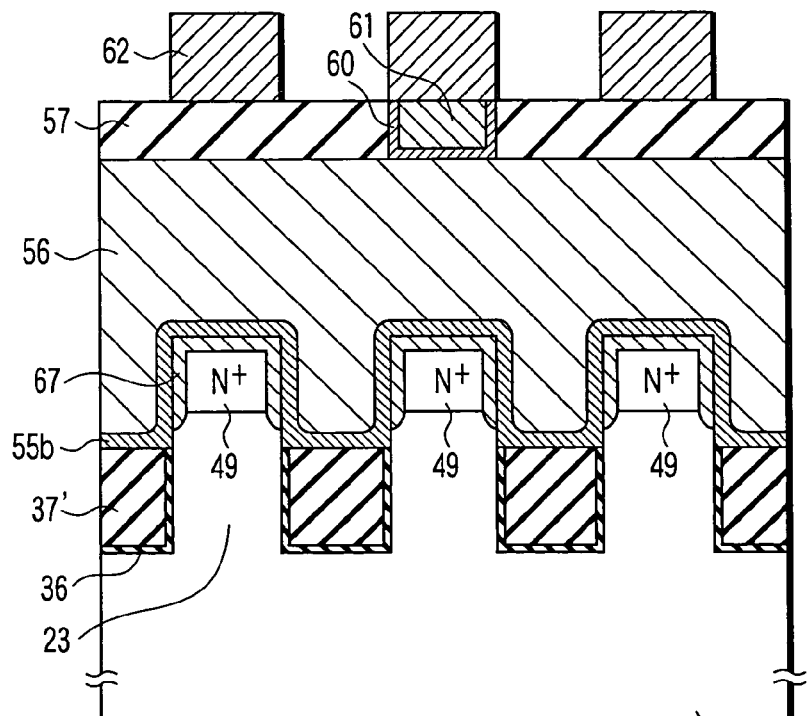
FIG. 35 is a sectional view schematically showing a structure in which the same processes as those shown in FIGS. 27 to 30 are executed to the structure shown in FIG. 34.

FIG. 35 shows an example in which, with respect to the structure shown in FIG. 34, the thick silicide layer 67 is formed, and then, the local interconnect wiring 56 is formed by executing the same processes as those shown in FIGS. 27 to 30, so that the local interconnect wiring 56 is electrically connected to the P well 23 in the semiconductor substrate 20.

In the above-described structure, the height of the embedded material in the STI region 37' positioned under the local interconnect wiring 56 is lower than the position of the depth of the N+ source diffusion layer 49 of the memory cell, and the local interconnect wiring 56 and the P well 23 are directly electrically connected to each other. With such a structure, the electrical connection between the silicide layer 67 of the local interconnect wiring 56 and P well 23 can be achieved. Moreover, since a distance between the silicide layer 67 at the drain side and the P well 23 can be ensured, it is possible to ensure a high breakdown voltage at the drain and the well region, and there is no case in which the breakdown voltage at the drain side is lowered.

Second Embodiment

In a second embodiment of the present invention, as in the first embodiment, a structure of a memory cell which has an local interconnect wiring using tungsten (W) as a local source line in an cell array of a NOR type flash memory cell carrying out channel erasing and channel hot electron writing, and a method for manufacturing the cell array will be described.

Figure 36:
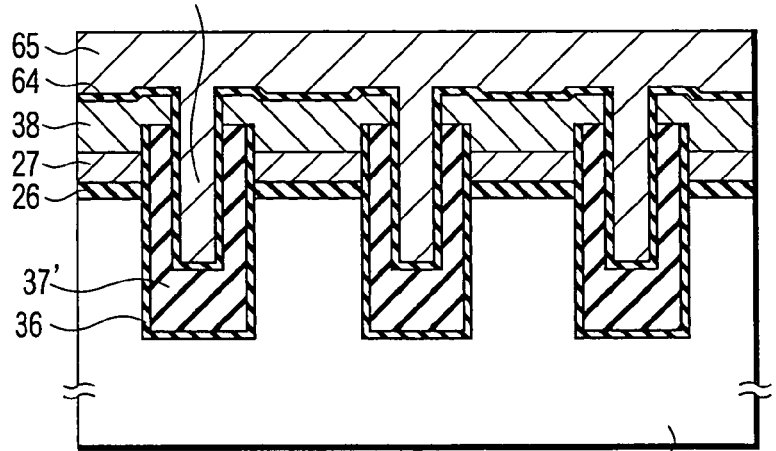
FIG. 36 is a schematic cross sectional view of a portion of a cell array, for explaining a method of manufacturing a NOR type flash memory according to a second embodiment of the present invention.

In the second embodiment, the same processes as those shown in FIGS. 1 to 15 in the first embodiment are executed, and the cell slits 39 are formed in the polycrystalline silicon 38 on the STI regions 37' to form a floating gate of the cell. Thereafter, as shown in FIG. 36, the embedded material of the STI region 37' is etched out to a predetermined depth to form a deep slit 63 therein. The pattern of the deep slit 63 is formed also at a portion at which the local interconnect wiring is formed. Thereafter, an ONO insulating film 64 is formed, and then, a polycrystalline silicon 65 which forms a control gate is deposited, followed by gate processing.

Figure 37:
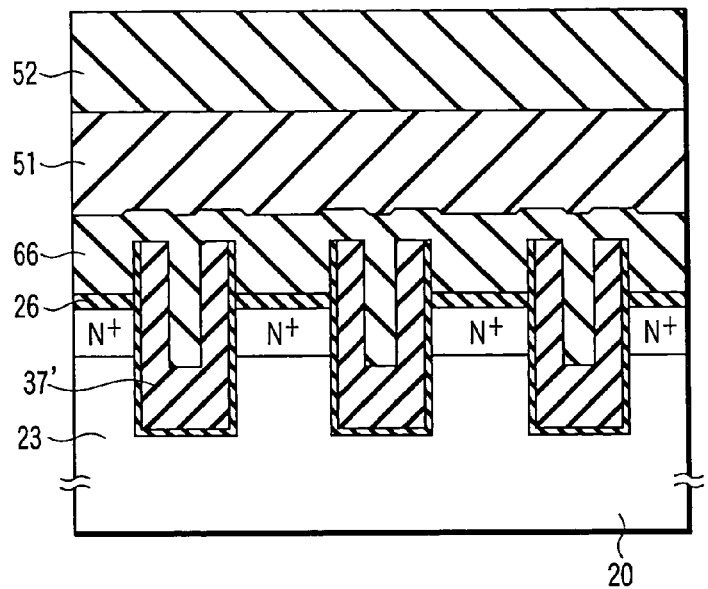
FIG. 37 is a schematic cross sectional view of the portion of the cell array, for explaining the method of manufacturing the NOR type flash memory according to the second embodiment of the present invention.

Moreover, in accordance with the same processes as those of the first embodiment, as shown in FIG. 37, the BPSG film 51 and deposition of the TEOS group oxide film 52 are deposited. Next, in accordance with the same processes as those of the first embodiment, a resist pattern is formed, and then, by using the resist pattern as a mask and by using a barrier nitride film 66 as a stopper, the TEOS group oxide film 52 and the BPSG film 51 are removed by dry etching, so that the bit line contact hole and the local interconnect wiring grooves are formed. At the time of removing the TEOS group oxide film 52 and the BPSG film 51, provided that processing is carried out under the condition that the selectivity of the nitride film 50 and the oxide films 52 and 37' is lowered, etching of the TEOS group oxide film 52 and the STI film 37' is further advanced in a pattern (rectangular pattern) such as the local interconnect wiring groove whose opening area is larger than that of the contact hole.

Figure 38:
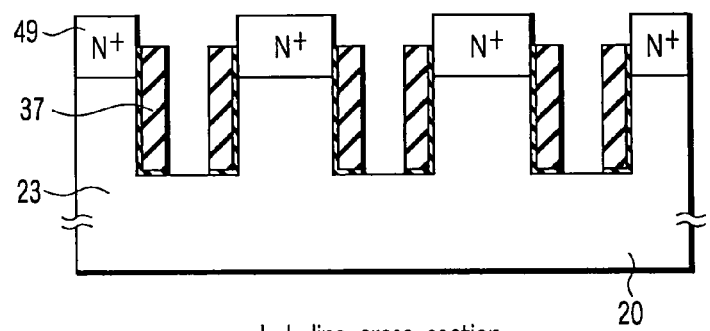
FIG. 38 is a schematic cross sectional view of the portion of the cell array, for explaining the method of manufacturing the NOR type flash memory according to the second embodiment of the present invention.

Next, in accordance with the same processes as those of the first embodiment, the above-described resist pattern used for forming the bit line contact holes and the local interconnect wiring grooves is removed, and thereafter, the barrier nitride films 66 at the bottom portions of the bit line contact holes and the bottom portions of the local interconnect wiring grooves are removed by dry etching, so that the Si substrates at the contact portions and the local interconnect wiring portions are exposed. At the time of removing the barrier nitride film 66, first, the barrier nitride film at the deep slit 63 portion is removed under the condition that the selectivity of the oxide film and the nitride film is made to be a predetermined value, and next, the processing is carried out under the condition that the selectivity of the oxide film and the nitride film is reduced. As a result, as shown in FIG. 38, the oxide film 37 at the STI region 37' under the deep slit is removed, and the deep slit leads to the P well 23.

Figure 39:
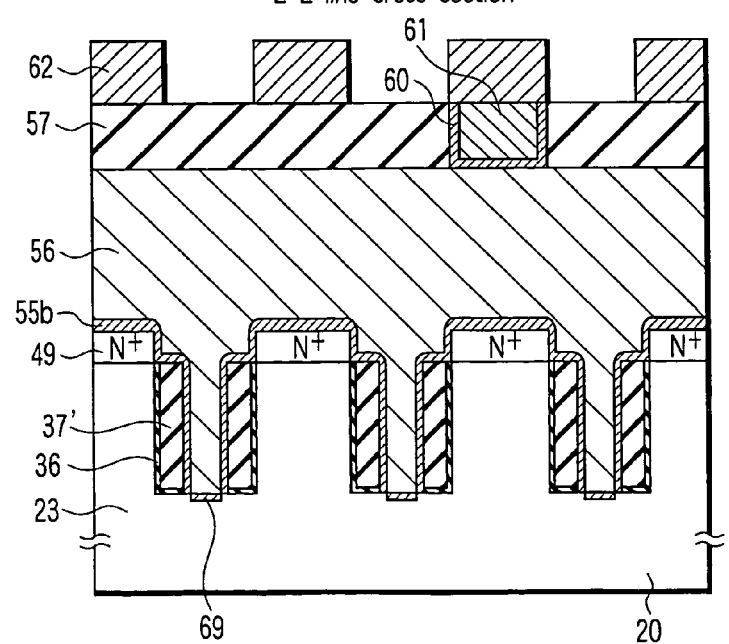
FIG. 39 is a schematic cross sectional view of the portion of the cell array, for explaining the method of manufacturing the NOR type flash memory according to the second embodiment of the present invention.

Thereafter, when the manufacturing process is completed by executing the same processes as those of the first embodiment, as shown in FIG. 39, a NOR type flash memory having a structure in which the local interconnect wiring 56 and the P well 23 are electrically connected via a silicide 69 at the bottom portion of the STI region 37' is obtained.

With the above-described structure, the local source line 56 can be directly electrically connected to the P well 23 at the bottom portion of the STI region 37', so that a satisfactory electrical connection is formed between the local source line 56 and the P well 23.

Third Embodiment

FIG. 40 shows one example of an electronic card using the NOR type flash memory described above and a structure of an electronic apparatus using the electronic card.

Here, a mobile electronic device is shown as one example of the electronic apparatus, and moreover, a digital still camera 70 is shown as one example thereof. An electronic card (for example a memory card) 71 used as a recording medium for the digital still camera 70 has an IC package PK1 in which NOR type flash memories as described above in the first embodiment are integrated and sealed.

A card slot 72 and a circuit board (not shown) connected thereto are accommodated in a case of the digital still camera 70, and the memory card 71 is detachably mounted in the card slot 72. The memory card 71 is electrically connected to an electronic circuit on the aforementioned circuit board when the memory card 71 is mounted in the card slot 72. Note that when the memory card 71 is, for example, a non-contact type IC card, the memory card 71 is electrically connected to the electronic circuit on the circuit board by a radio signal when the memory card 71 is accommodated in or is close to the card slot 72.

In FIG. 40, reference numeral 73 is a lens, reference numeral 74 is a display unit (for example a liquid crystal monitor), reference numeral 75 is an operation button (for example a shutter button), and reference numeral 76 is a strobe.

Figure 41:
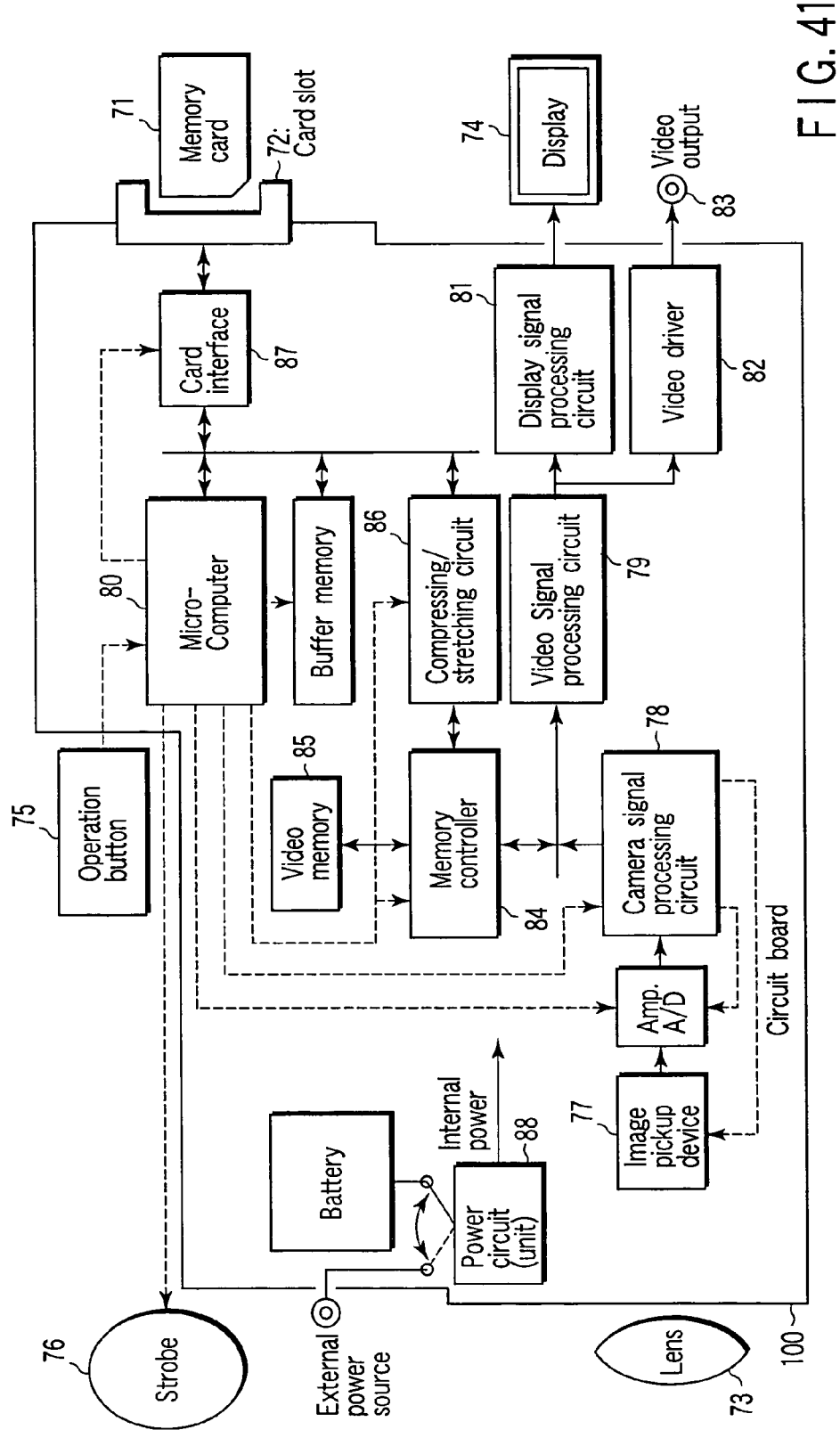
FIG. 41 is a block diagram showing a basic structural example of the digital still camera shown in FIG. 40.

FIG. 41 shows a basic configuration of the digital still camera shown in FIG. 40.

A light from an object is condensed by the lens 73, and is inputted to an image pickup device 77. The image pickup device (for example a CMOS image sensor) 77 converts the inputted light to an electric signal, and outputs, for example, an analog signal. This analog signal is amplified at an analog amplifier (AMP), and then, converted to a digital signal by an analog/digital converter (A/D). The converted signal is inputted to a camera signal processing circuit 78, and subjected to, for example, automatic exposure control (AE), automatic white balance control (AWB), and color separation processing. Thereafter, the signal is converted into a luminance signal and a color-difference signal.

When an image is monitored, the signal outputted from the camera signal processing circuit 78 is inputted to a video signal processing circuit 79 and converted into a video signal. As a system of the video signal, NTSC (National Television System Committee) can be sampled. The image pickup device 77, the AMP, the A/D, and the camera signal processing circuit 78 are controlled by a microcomputer 80.

The video signal is outputted to the display 74 attached to the digital still camera 70 via a display signal processing circuit 81. Further, the video signal is supplied to a video output terminal 83 via a video driver 82.

In this way, the image picked up by the digital still camera 70 is outputted to an image device such as, for example, a television or the like, as a video output via the video output terminal 83. Thus, the picked-up image can be displayed on a device other than the display 74.

When an image is to be captured, an operator presses the operation button 75. When the operation button 75 is pressed, the microcomputer 80 controls a memory controller 84, and the signal outputted from the camera signal processing circuit 78 is written into a video memory 85 as a frame image. The frame image written in this way is compressed on the basis of a predetermined compression format by a compressing/stretching circuit 86, and is recorded in the memory card 71 mounted in the card slot 72 via a card interface 87.

When the recorded image is to be played back, the image recorded in the memory card 71 is read via the card interface 87, stretched by the compressing/stretching circuit 86, and then, written into the video memory 85. The written image is inputted to the video signal processing circuit 79, and is projected on the display 74 on the display 74 or an image device in the same way as in the case of monitoring the image.

In the above-described configuration, the card slot 72, the image pickup device 77, the AMP, the A/D, the camera signal processing circuit 78, the video signal processing circuit 79, the display 74, the video driver 82, the microcomputer 80, the memory controller 84, the video memory 85, the compressing/stretching circuit 86, and the card interface 87 are mounted on a circuit board 100. Here, there is no need for the card slot 72 to be mounted on the circuit board 100, and the card slot 72 may be connected to the circuit board 100 through a connector cable or the like.

Further, a power circuit (for example, a DC/DC converter) 88 is mounted on the circuit board 100. The power circuit 88 receives power supply from an external power supply or a battery, and generates an internal source voltage to be used in the digital still camera 70. The internal source voltage is supplied further to the strobe 76 and the display 74, in addition to the circuits described above.

Figure 42:
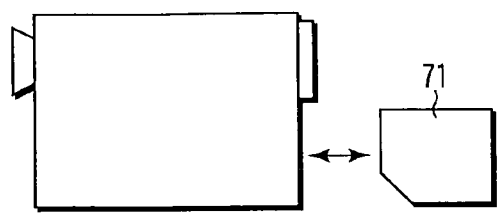
FIG. 42 is a schematic diagram showing an example of the electronic apparatus using the electronic card shown in FIG. 40.
Figure 47:
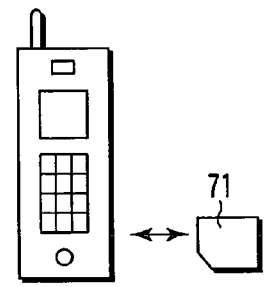
FIG. 47 is a schematic diagram showing a further example of the electronic apparatus using the electronic card shown in FIG. 40.
Figure 43:
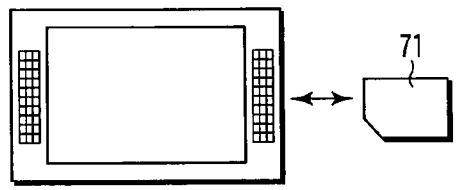
FIG. 43 is a schematic diagram showing another example of the electronic apparatus using the electronic card shown in FIG. 40.
Figure 48:
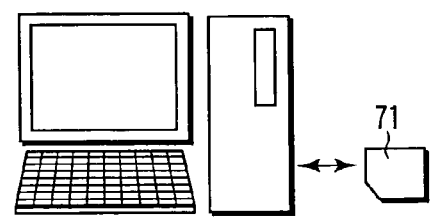
FIG. 48 is a schematic diagram showing a further example of the electronic apparatus using the electronic card shown in FIG. 40.
Figure 44:
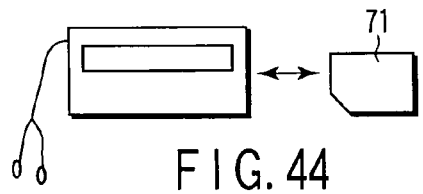
FIG. 44 is a schematic diagram showing a further example of the electronic apparatus using the electronic card shown in FIG. 40.
Figure 49:
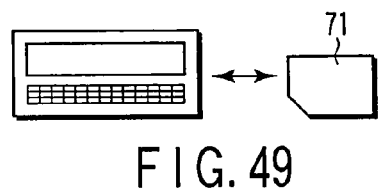
FIG. 49 is a schematic diagram showing a further example of the electronic apparatus using the electronic card shown in FIG. 40.
Figure 45:
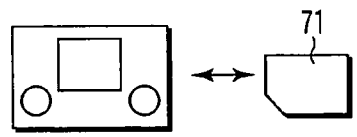
FIG. 45 is a schematic diagram showing a further example of the electronic apparatus using the electronic card shown in FIG. 40.
Figure 50:
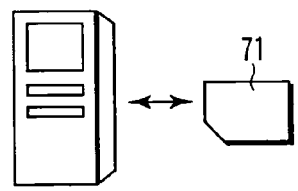
FIG. 50 is a schematic diagram showing a further example of the electronic apparatus using the electronic card shown in FIG. 40.
Figure 46:
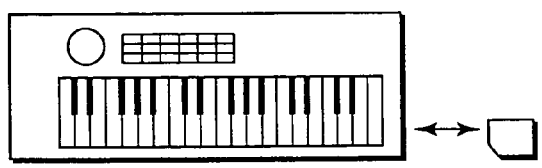
FIG. 46 is a schematic diagram showing a further example of the electronic apparatus using the electronic card shown in FIG. 40.
Figure 51:
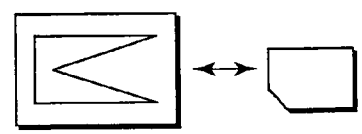
FIG. 51 is a schematic diagram showing a further example of the electronic apparatus using the electronic card shown in FIG. 40.

The electronic card 71 in accordance with the present embodiment can be applied to, not only a mobile electronic device such as the digital still camera described above or the like, but also, for example, various devices shown in FIGS. 42 to 51 as well. Namely, FIG. 42 shows a video camera, FIG. 43 shows a television, FIG. 44 shows an audio device, FIG. 45 shows a game device, FIG. 46 shows an electronic instrument, FIG. 47 shows a mobile telephone, FIG. 48 shows a personal computer, FIG. 49 shows a personal digital assistant (PDA), FIG. 50 shows a voice recorder, and FIG. 51 shows a PC card (for example a PC card memory) having, for example, a PCMCIA standard format.

With the nonvolatile memory semiconductor apparatus described in the embodiments, the local source line and the well region including the cell array are electrically connected to each other in a state in which a distance between the local source line and the well region is made short in the cell array of the NOR type flash memory. Thus, rise of the source electric potential (i.e., rise of the electric potential of the local source line) of the memory cell at the time of writing data into the selected memory cell can be suppressed, a deterioration in the writing characteristic of the memory cell can be prevented, and the number of cells to which writings can be carried out at a time can be increased. In this case, provided that it is a NOR type flash memory carrying out channel erasing and channel hot electron writing, the cell source and the well region are set to the same electric potential at the time of the operation, and therefore, there is no problem even if the local source line and the well region are electrically connected to each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor storage apparatus comprising:

a NOR type cell array including memory cells arranged in a row direction and a column direction, each of the memory cells having a source region, a drain region and a channel region formed in a well region formed in a surface layer of a semiconductor substrate, a floating gate formed on the well region via a gate insulating film and a control gate formed on the floating gate via an inter-gate insulating film, two adjacent the memory cells arranged in the column direction forming a set and sharing the drain region, two adjacent sets of the memory cells arranged in the column direction sharing the source region, and a plurality of columns of the memory cells being isolated by trench type element isolation regions;

a plurality of word lines arranged on the cell array and extending in the row direction in correspondence to a plurality of rows, each of the word lines being commonly connected to a control gate of each of the memory cells on a corresponding row;

a plurality of local source lines formed of metal wirings, the local source lines being arranged on the cell array and extending in the row direction in correspondence to a plurality of rows, each of the local source lines extending in the row direction to run on the source regions of the memory cells on a corresponding row and the element isolation regions isolating the columns of the memory cells, and being commonly connected to the source regions of the memory cells on the corresponding row;

a plurality of bit lines formed of metal wirings, the metal wirings being arranged on the cell array and extending in the column direction in correspondence to a plurality of columns, and each of the bit lines being commonly connected to the drain regions of the memory cells on a corresponding column; and a plurality of main source lines formed of metal wirings, the main source lines being arranged intermittently between the columns of the bit lines on the cell array and extending in the column direction, and each of the main source lines being commonly connected to the local source lines, wherein a height of embedded material layers in the element isolation regions under the local source lines or a height of a portion of the embedded material layers contacting the semiconductor substrate is lower than an upper surface of the source regions under the local source lines, and the local source lines and the well region are electrically connected to each other in the cell array.

2. A nonvolatile semiconductor storage apparatus according to claim 1, wherein the height of the embedded material layers in the element isolation regions under the local source lines is lower than a depth of the source regions of the memory cells, and the local source lines and the well region are directly electrically connected to each other.

3. A nonvolatile semiconductor storage apparatus according to claim 1, wherein the semiconductor substrate is a silicon substrate, a barrier metal is provided on a bottom portion of the local source lines, and a silicide layer formed by reaction of the silicon substrate with the barrier metal extends to a position deeper than a depth of the source regions of the memory cells.

4. A nonvolatile semiconductor storage apparatus according to claim 1, wherein a barrier metal is provided on a bottom portion of the bit lines at which the bit lines contacts the drain regions, and a silicide layer formed by reaction of the drain regions with the barrier metal is thinner than the silicide layer provided on a bottom portion of the local source lines.

5. A nonvolatile semiconductor storage apparatus according to claim 1, wherein an opening is formed in the embedded material in the element isolation regions under the local source lines, the opening reaches the well region at the bottom portion of the element isolation regions, and the local source lines are embedded in the opening to be directly connected to the well region.

6. A nonvolatile semiconductor storage apparatus according to claim 1, wherein the storage apparatus comprises a NOR type flash memory which carries out channel erasing and channel hot electron writing.

* * * * *